(12) United States Patent
Yamada et al.

(10) Patent No.: US 12,178,094 B2
(45) Date of Patent: Dec. 24, 2024

(54) DISPLAY DEVICE

(71) Applicant: SHARP KABUSHIKI KAISHA, Sakai (JP)

(72) Inventors: Junichi Yamada, Sakai (JP); Naoki Ueda, Osaka (JP); Fumiyuki Kobayashi, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 91 days.

(21) Appl. No.: 17/768,796

(22) PCT Filed: Nov. 6, 2019

(86) PCT No.: PCT/JP2019/043515
§ 371 (c)(1),
(2) Date: Apr. 13, 2022

(87) PCT Pub. No.: WO2021/090408
PCT Pub. Date: May 14, 2021

(65) Prior Publication Data
US 2024/0090281 A1    Mar. 14, 2024

(51) Int. Cl.
*H10K 59/131* (2023.01)
*G09G 3/3233* (2016.01)

(52) U.S. Cl.
CPC ......... *H10K 59/131* (2023.02); *G09G 3/3233* (2013.01); *G09G 2300/0819* (2013.01); *G09G 2300/0842* (2013.01); *G09G 2300/0861* (2013.01)

(58) Field of Classification Search
CPC ............ G02F 1/1333–13478; G02F 1/133388; H10K 59/12–1315; H10K 59/80–88
See application file for complete search history.

(56) References Cited

U.S. PATENT DOCUMENTS

| | | | |
|---|---|---|---|
| 10,763,323 B2 * | 9/2020 | Moy | H10K 77/111 |
| 2009/0102758 A1 * | 4/2009 | Anzai | G09G 3/3266 345/76 |
| 2017/0288002 A1 | 10/2017 | Kim et al. | |
| 2018/0019294 A1 | 1/2018 | Zhai | |
| 2018/0047802 A1 | 2/2018 | Yoon et al. | |
| 2018/0145127 A1 | 5/2018 | Shin et al. | |
| 2019/0006442 A1 * | 1/2019 | Byun | H10K 59/873 |
| 2019/0043938 A1 | 2/2019 | Lee et al. | |
| 2019/0229177 A1 | 7/2019 | Kim et al. | |

* cited by examiner

*Primary Examiner* — Eric A. Ward
(74) *Attorney, Agent, or Firm* — ScienBiziP, P.C.

(57) ABSTRACT

In a display device, a first power supply voltage line includes a first trunk wiring line, a plurality of branch wiring lines, and a second power supply voltage line includes a second trunk wiring line. The first trunk wiring line includes a first portion and a second portion. A line width of the first portion is smaller than a line width of the second portion. A frame region in a frame region provided with the first portion includes a first irregular frame edge having an irregular shape.

20 Claims, 12 Drawing Sheets

DISPLAY DEVICE

TECHNICAL FIELD

The disclosure relates to a display device.

BACKGROUND ART

In recent years, various display devices including a light-emitting element have been developed. Particularly, a display device including an Organic Light Emitting Diode (OLED) and a display device including an inorganic light-emitting diode or a Quantum dot Light Emitting Diode (QLED) have drawn a great deal of attention because these devices offer advantages such as lower power consumption, smaller thickness, and higher picture quality.

In the field of such display devices, an attempt is made to achieve a narrow frame of the display device by reducing a frame region, which is a region that does not contribute to display, and also increasing the proportion of a display region being a region where display is performed.

However, in the field of such display devices, when a frame region provided with a terminal portion is desired to be reduced, frame narrowing may be limited by a width dimension of a power source wiring line for a light-emitting element (for example, a trunk wiring line of an ELVDD voltage line and a trunk wiring line of an ELVSS voltage line) of an OLED, a QLED, and the like provided in parallel with the terminal portion.

The trunk wiring line of the ELVDD voltage line being one of the power source wiring lines for the light-emitting element generally has a rectangular shape having a line width equal to or greater than a predetermined width and is formed in parallel with the terminal portion. For example, PTL 1 discloses that a trunk wiring line of an ELVDD voltage line has a rectangular shape having a line width equal to or greater than a predetermined width and is formed in parallel with a terminal portion.

CITATION LIST

Patent Literature

PTL 1: US 2018/0047802 A1 (published Feb. 15, 2018)

SUMMARY

Technical Problem (a) of FIG. 12 and (b) of FIG. 12 are diagrams for describing a reason that frame narrowing of a frame region NDA provided with a terminal portion TER is limited in display devices 200a and 200b in which a trunk wiring line ELVDDM1 of an ELVDD voltage line has a rectangular shape having a line width equal to or greater than a predetermined width and is formed in parallel with the terminal portion TER.

The display device 200a including a display panel PA illustrated in (a) of FIG. 12 includes a rectangle display region DA, the frame region NDA around the display region DA, the terminal portion TER provided on one edge of the frame region NDA, the ELVDD voltage line, and an ELVSS voltage line.

The ELVDD voltage line includes the trunk wiring line ELVDDM1 formed parallel to the terminal portion TER in the rectangular shape having the line width equal to or greater than the predetermined width, a plurality of branch wiring lines (not illustrated) electrically connected to the trunk wiring line ELVDDM1, and two lead wiring lines ELVDDH1 extending from each of a terminal TP2 and a terminal TPn−1 of the terminal portion TER and being electrically connected to the trunk wiring line ELVDDM1.

Meanwhile, the ELVSS voltage line includes a trunk wiring line ELVSSM1 provided in a frame-like shape in the frame region NDA so as to surround an edge of the display region DA except for a part of a lower side of the display region DA in the drawing, and two lead wiring lines ELVSSH1 extending from each of a terminal TP1 and a terminal TPn of the terminal portion TER and being electrically connected to the trunk wiring line ELVSSM1.

The display device 200b including a display panel PA' illustrated in (b) of FIG. 12 is different from the display device 200a illustrated in (a) of FIG. 12 in that the display device 200b includes a display region DA1 having an irregular shape, and is similar to the display device 200a illustrated in (a) of FIG. 12 in other points.

In a case of both of the display device 200a illustrated in (a) of FIG. 12 and the display device 200b illustrated in (b) of FIG. 12, the trunk wiring line ELVDDM1 of the ELVDD voltage line has the rectangular shape having the line width equal to or greater than the predetermined width and is formed in parallel with the terminal portion TER. The rectangular trunk wiring line ELVDDM1 has a uniform line width in accordance with a central portion of the trunk wiring line ELVDDM1 that is electrically connected to the two lead wiring lines ELVDDH1 and needs a relatively thick line width. Therefore, in the frame region NDA provided with the trunk wiring line ELVDDM1, a distance from an edge of the trunk wiring line ELVDDM1 on a side of the display regions DA and DA1 to edges K1 and K2 of the frame region NDA needs to be equal to or greater than L1. The distance L1 is formed of the line width of the rectangular trunk wiring line ELVDDM1, a distance for ensuring insulation between the trunk wiring line ELVDDM1 and the trunk wiring line ELVSSM1, a line width of the trunk wiring line ELVSSM1, and a minimum margin width between the trunk wiring line ELVSSM1 and the edges K1 and K2 of the frame region NDA.

As described above, in the display device 200a and the display device 200b including the known rectangular trunk wiring line ELVDDM1, there is a problem that frame narrowing cannot be achieved in the frame region NDA provided with the trunk wiring line ELVDDM1.

An aspect of the disclosure is made in view of the problem described above, and has an object to provide a display device that can achieve frame narrowing in a frame region provided with a trunk wiring line of a first power supply voltage line.

Solution to Problem

In order to solve the problem described above, a display device according to the disclosure includes:
  a display region;
  a frame region surrounding the display region;
  a plurality of light-emitting elements provided in the display region; and
  a terminal portion provided on one edge of the frame region,
  wherein the display device further includes a first power supply voltage line and a second power supply voltage line,
  the first power supply voltage line includes a first trunk wiring line, and a plurality of branch wiring lines, the first trunk wiring line is provided in the frame region along a first edge portion of the display region including a first side facing the terminal portion, the plurality of branch wiring lines are electrically connected to the first trunk wiring line, extend from the first trunk wiring line in a direction intersecting the first edge portion, and are provided in the frame region and the display region, the first trunk wiring line includes a first portion connected to a part of each of the plurality of branch wiring lines intersecting an end portion of the first edge portion among the plurality of branch wiring lines, and includes a second portion connected to another part of the branch wiring line intersecting a central portion of the first edge portion among the plurality of branch wiring lines, the second power supply voltage line includes a second trunk wiring line provided in the frame region, each of the plurality of light-emitting elements includes a first electrode, a second electrode, and a light-emitting layer formed between the first electrode and the second electrode, the second trunk wiring line is electrically connected to the second electrode, a line width of the first portion is smaller than a line width of the second portion, and an edge of the frame region provided with the first portion includes a first irregular frame edge having an irregular shape.

Advantageous Effects of Disclosure

An aspect of the disclosure can provide a display device that can achieve frame narrowing in a frame region provided with a trunk wiring line of a first power supply voltage line.

DESCRIPTION OF EMBODIMENTS

Embodiments of the disclosure will be described with reference to FIGS. 1 to 11 as follows. Hereinafter, for convenience of explanation, components having the same functions as those described in a specific embodiment are appended with the same reference signs, and descriptions thereof may be omitted.

First Embodiment

Figure 1:
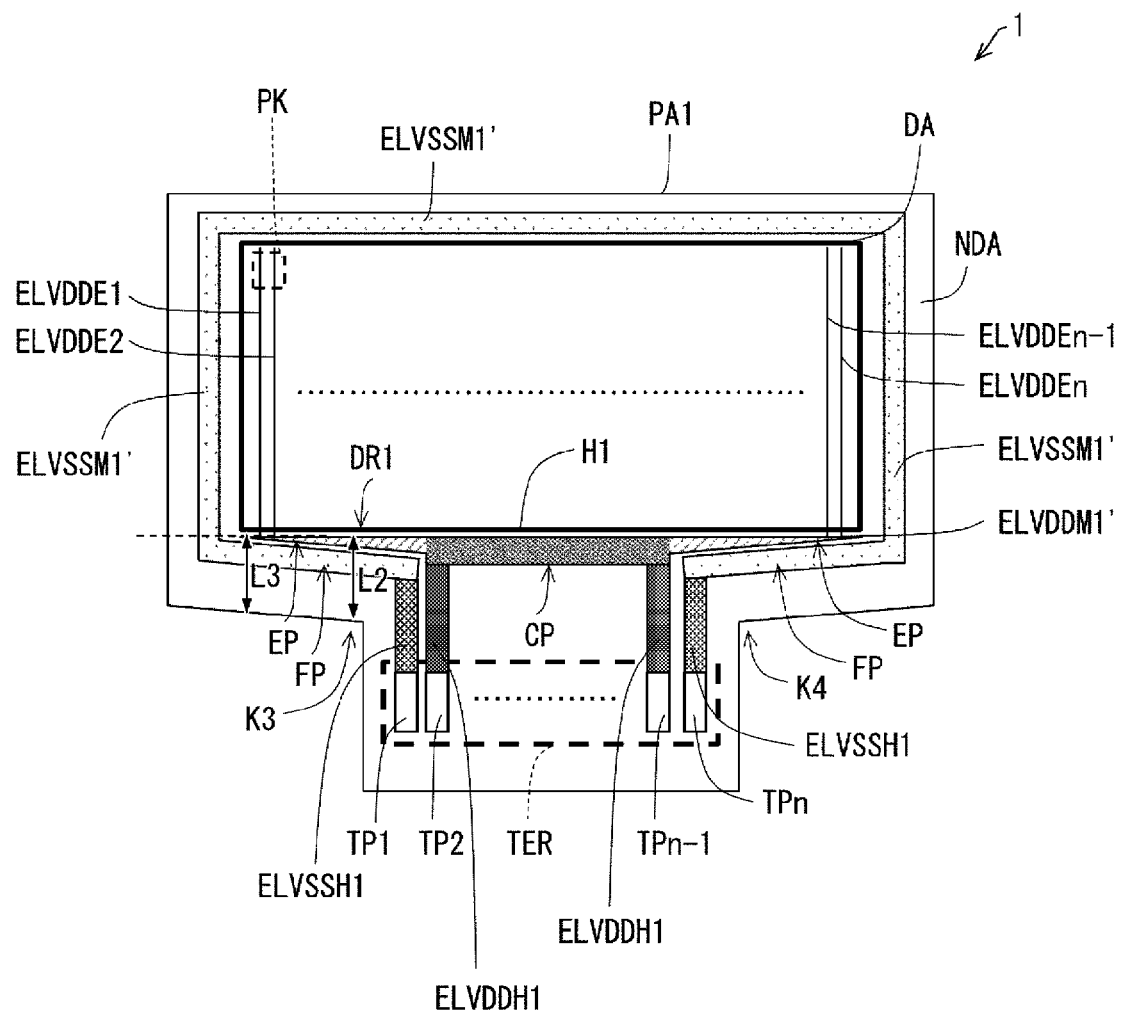
FIG. 1 is a schematic plan view illustrating a general configuration of a display device according to a first embodiment.

FIG. 1 is a schematic plan view illustrating a general configuration of a display device 1 according to a first embodiment.

Figure 2:
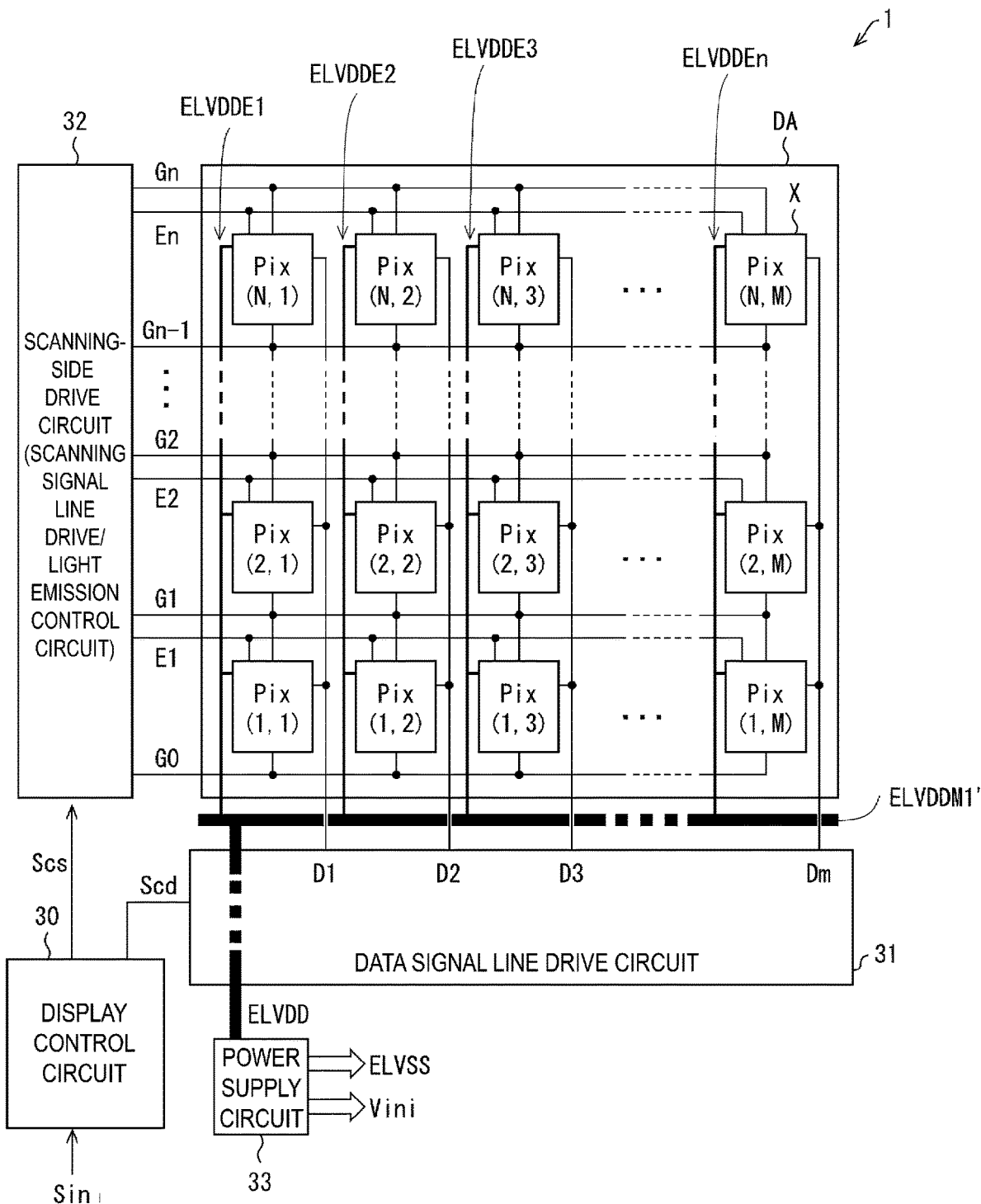
FIG. 2 is a diagram illustrating a configuration example of a circuit of the display device according to the first embodiment.

FIG. 2 is a diagram illustrating a configuration example of a circuit of the display device 1 according to the first embodiment.

The display device 1 illustrated in FIGS. 1 and 2 includes a display panel PA1, a drive circuit (a display control circuit 30, a data signal line drive circuit 31, a scanning-side drive circuit 32, and a power supply circuit 33) for driving the display panel PA1, and includes, in the display panel PA1, a rectangle display region DA, a frame region NDA around the display region DA, a terminal portion TER provided on one edge of the frame region NDA, an ELVDD voltage line, and an ELVSS voltage line. Further, a plurality of light-emitting elements X are provided in the display region DA.

As illustrated in FIG. 1, the ELVDD voltage line (first power supply voltage line) includes a first trunk wiring line ELVDDM1', a plurality of branch wiring lines ELVDDE1 to ELVDDEn electrically connected to the first trunk wiring line ELVDDM1', and two lead wiring lines ELVDDH1 extending from each of a terminal TP2 and a terminal TPn−1 of the terminal portion TER and being electrically connected to the first trunk wiring line ELVDDM1'.

Meanwhile, as illustrated in FIG. 1, the ELVSS voltage line (second power supply voltage line) includes a second trunk wiring line ELVSSM1' provided in the frame region NDA so as to surround an edge portion of the display region DA except for a part of an edge portion facing the terminal portion TER on a lower side in the drawing, and two lead wiring lines ELVSSH1 extending from each of a terminal TP1 and a terminal TPn of the terminal portion TER and being electrically connected to the second trunk wiring line ELVSSM1'.

Note that, in the present embodiment, a case where the two lead wiring lines ELVDDH1 and the two lead wiring lines ELVSSH1 are provided is described as an example, but the present embodiment is not limited thereto. The lead wiring line ELVDDH1 and the lead wiring line ELVSSH1 may each be one, or each be three or more.

As illustrated in FIG. 1, the first trunk wiring line ELVDDM1' is provided in the frame region NDA along a first edge portion DR1 of the display region DA including a first side H1 of the display region DA facing the terminal portion TER. Note that, since the display device 1 illustrated in FIG. 1 includes the rectangle display region DA, the first side H1 of the display region DA facing the terminal portion TER and the first edge portion DR1 of the display region DA are the same, and the first trunk wiring line ELVDDM1' is provided in the frame region NDA along an extension direction of the first side H1.

As illustrated in FIG. 1, the plurality of branch wiring lines ELVDDE1 to ELVDDEn of the ELVDD voltage line are electrically connected to the first trunk wiring line ELVDDM1', extend from the first trunk wiring line ELVDDM1' in a direction intersecting the first edge portion DR1 of the display region DA including the first side H1 on the lower side in the drawing, and are provided in the frame region NDA and the display region DA. Note that the extension direction of the first side H1 of the display region DA and an extension direction of the plurality of branch wiring lines ELVDDE1 to ELVDDEn of the ELVDD voltage line are orthogonal to each other.

As illustrated in FIG. 1, the first trunk wiring line ELVDDM1' includes a narrow portion EP connected to some of the branch wiring lines (for example, ELVDDE1, ELVDDE2, ELVDDEn-1, ELVDDEn, and the like) intersecting an end portion of the first edge portion DR1 of the display region DA among the plurality of branch wiring lines ELVDDE1 to ELVDDEn, and includes a thick portion CP connected to some other of the branch wiring lines (not illustrated) intersecting a central portion of the first edge portion DR1 of the display region DA among the plurality of branch wiring lines ELVDDE1 to ELVDDEn. Note that a line width of the narrow portion EP of the first trunk wiring line ELVDDM1' in the extension direction of the branch wiring lines ELVDDE1 to ELVDDEn is smaller than a line width of the thick portion CP of the first trunk wiring line ELVDDM1' in the extension direction of the branch wiring lines ELVDDE1 to ELVDDEn.

In the display panel PA1 illustrated in FIG. 1, a current flows through the entire surface of the display region DA, and thus a central portion of the first trunk wiring line ELVDDM1' that is electrically connected to the two lead wiring lines ELVDDH1 and needs a relatively thick line width is the thick portion CP of the first trunk wiring line ELVDDM1'. Meanwhile, the number of the branch wiring lines as a target through which a current flows decreases with decreasing distance from the end portion of the first edge portion DR1 of the display region DA. Thus, a current flowing through the first trunk wiring line ELVDDM1' corresponding to the end portion of the first edge portion DR1 of the display region DA decreases. Therefore, the line width of the narrow portion EP of the first trunk wiring line ELVDDM1' can be made smaller than the line width of the thick portion CP of the first trunk wiring line ELVDDM1'.

A ratio between a length of the narrow portion EP in a direction of the first edge portion DR1 and a length of the thick portion CP in the direction of the first edge portion DR1 can be set to, for example, 1:3 to 1:4, which is not limited thereto. The ratio can be set as appropriate in consideration of specifications of a display panel and the like. Note that the plurality of branch wiring lines ELVDDE1 to ELVDDEn are disposed at the same interval. Thus, for example, when a ratio among a length of the narrow portion EP on a left side of the thick portion CP, a length of the thick portion CP, and a length of the narrow portion EP on a right side of the thick portion CP is, for example, 1:3:1, 60% of the branch wiring lines ELVDDE1 to ELVDDEn are electrically connected to the thick portion CP of the first trunk wiring line ELVDDM1', 20% of the branch wiring lines ELVDDE1 to ELVDDEn are electrically connected to the narrow portion EP on the left side of the thick portion CP of the first trunk wiring line ELVDDM1', and 20% of the branch wiring lines ELVDDE1 to ELVDDEn are electrically connected to the narrow portion EP on the right side of the thick portion CP of the first trunk wiring line ELVDDM1'.

Figure 12:
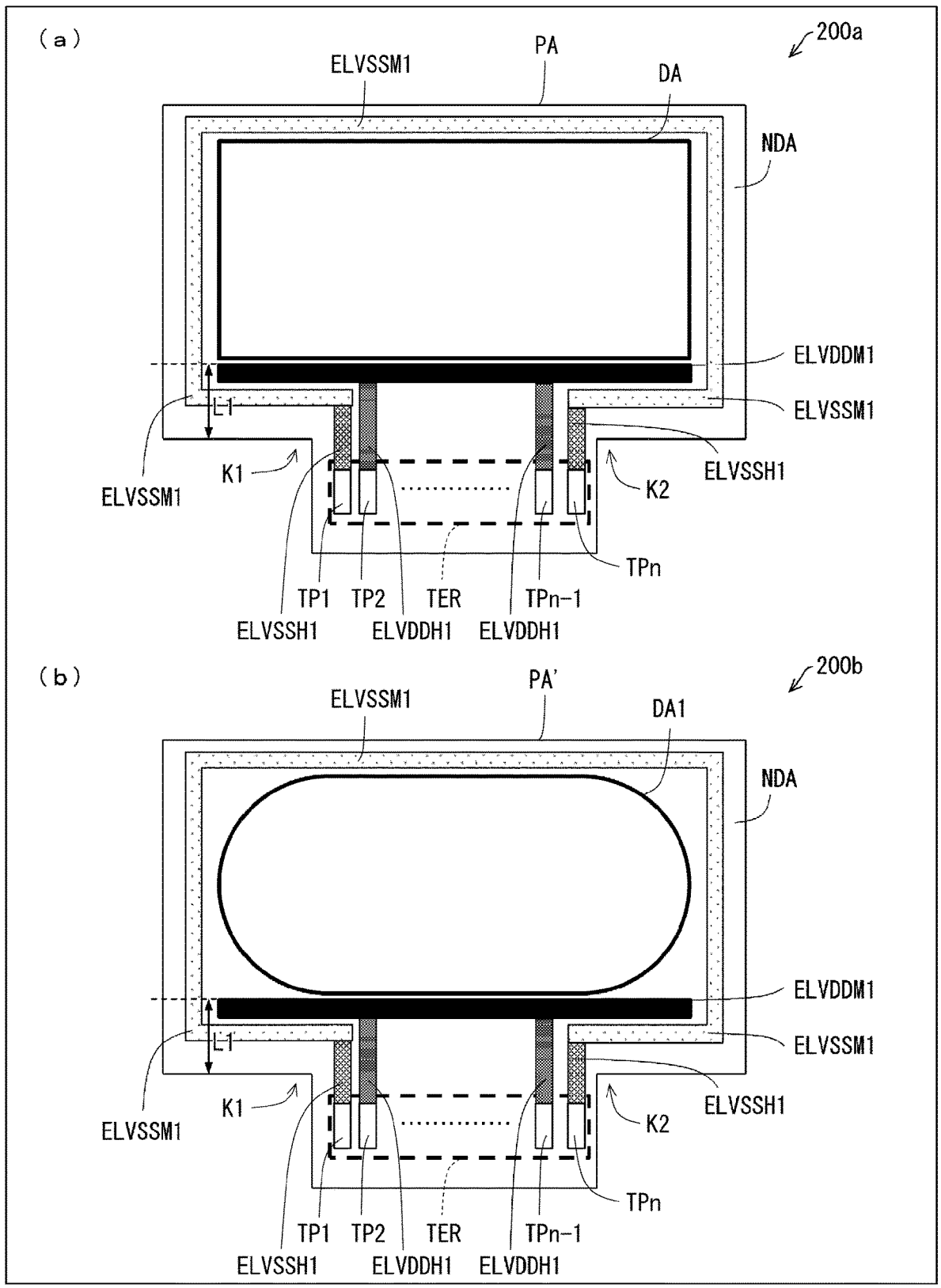
FIGS. 12(a) and (b) are diagrams for describing a reason that frame narrowing of a frame region provided with a terminal portion is limited in a known display device.

Unlike a known manner, the first trunk wiring line ELVDDM1' does not have a rectangular shape (see (a) of FIG. 12 and (b) of FIG. 12) in which a line width of the central portion and the portion having a concentrated current and being connected to the lead wiring line ELVDDH1, which need a relatively thick line width, remains as it is even in the end portion. As illustrated in FIG. 1, the first trunk wiring line ELVDDM1' has a shape with, as the thick portion CP, only the central portion and the portion having a concentrated current and being connected to the lead wiring line ELVDDH1, which need a relatively thick line width, and with the narrow portion EP on both ends of the thick portion CP. Note that, because a current concentrates in the portion connected to the lead wiring line ELVDDH1, for example, similarly to a thick portion CP of a first trunk wiring line ELVDDM4' included in a display device 1b illustrated in FIG. 6 according to a third embodiment described below, and a thick portion CP of a first trunk wiring line ELVDDM6' included in a display device 1d illustrated in FIG. 9 according to a fifth embodiment described below, it is preferable that a width of the thick portion CP of the first trunk wiring lines ELVDDM4' and ELVDDM6' in an extension direction of a first side H1 is greater than a width acquired by combining a width of the two lead wiring lines ELVDDH1 in the extension direction of the first side H1 and a width between the two lead wiring lines ELVDDH1 in the extension direction of the first side H1.

A voltage of the ELVDD voltage line (first power supply voltage line) is preferably supplied to the thick portion CP of the first trunk wiring line ELVDDM1' through the lead wiring line ELVDDH1 of the ELVDD voltage line (first power supply voltage line) extending from the terminal portion TER.

In the frame region NDA provided with the narrow portion EP of the first trunk wiring line ELVDDM1', the line width of the narrow portion EP is smaller than the line width of the thick portion CP, and thus distances L2 and L3 from an edge of the first trunk wiring line ELVDDM1' on the display region DA side to edges K3 and K4 of the frame region NDA in the extension direction of the branch wiring lines ELVDDE1 to ELVDDEn can be reduced. The distances L2 and L3 are formed of the line width of the narrow portion EP of the first trunk wiring line ELVDDM1', a distance for ensuring insulation between the narrow portion EP of the first trunk wiring line ELVDDM1' and the second trunk wiring line ELVSSM1', a line width of the second trunk wiring line ELVSSM1', and a minimum margin width between the second trunk wiring line ELVSSM1' and the edges K3 and K4 of the frame region NDA. Note that a portion other than the line width of the narrow portion EP of the first trunk wiring line ELVDDM1' included in the distances L2 and L3 can be set similar to that of the known configuration (see (a) of FIG. 12 and (b) of FIG. 12).

In the present embodiment, as illustrated in FIG. 1, a case where the line width of the narrow portion EP of the first trunk wiring line ELVDDM1' in the extension direction of the branch wiring lines ELVDDE1 to ELVDDEn gradually decreases with increasing distance from a boundary between the narrow portion EP of the first trunk wiring line ELVDDM1' and the thick portion CP of the first trunk wiring line ELVDDM1' is described as an example. However, a shape of the narrow portion EP of the first trunk wiring line ELVDDM1' is not particularly limited as long as the line width of the narrow portion EP of the first trunk wiring line ELVDDM1' in the extension direction of the branch wiring lines ELVDDE1 to ELVDDEn is smaller than the line width of the thick portion CP of the first trunk wiring line ELVDDM1' in the extension direction of the branch wiring lines ELVDDE1 to ELVDDEn.

In the present embodiment, the line width of the narrow portion EP of the first trunk wiring line ELVDDM1' gradually decreases with increasing distance from the boundary between the narrow portion EP of the first trunk wiring line ELVDDM1' and the thick portion CP of the first trunk wiring line ELVDDM1'. Thus, as illustrated in FIG. 1, the distance L2 from the edge of the narrow portion EP of the first trunk wiring line ELVDDM1' on the display region DA side to the edges K3 and K4 of the frame region NDA, which is closer to the boundary between the narrow portion EP of the first trunk wiring line ELVDDM1' and the thick portion CP of the first trunk wiring line ELVDDM1', is greater than the distance L3 from the edge of the narrow portion EP of the first trunk wiring line ELVDDM1' on the display region DA side to the edges K3 and K4 of the frame region NDA, which is farther from the boundary between the narrow portion EP of the first trunk wiring line ELVDDM1' and the thick portion CP of the first trunk wiring line ELVDDM1'.

As described above, the display device 1 including the display panel PA1 can achieve frame narrowing in the frame region NDA provided with the narrow portion EP of the first trunk wiring line ELVDDM1'.

As illustrated in FIG. 1, in the display device 1 including the display panel PA1, the edge of the frame region NDA provided with the narrow portion EP of the first trunk wiring line ELVDDM1' includes first irregular frame edges K3 and K4 having an irregular shape. Note that the first irregular frame edges K3 and K4 are edges in which a width of at least a part of the frame region NDA provided with the narrow portion EP of the first trunk wiring line ELVDDM1' in the extension direction of the branch wiring lines ELVDDE1 to ELVDDEn is formed to be smaller than a width of the frame region NDA provided with the thick portion CP of the first trunk wiring line ELVDDM1' in the extension direction of the branch wiring lines ELVDDE1 to ELVDDEn.

In the present embodiment, a case where the first edge portion DR1 of the display region DA is the same straight edge as the first side H1 as described above, the thick portion CP of the first trunk wiring line ELVDDM1' is a straight portion formed along the first side H1 of the display region DA, and the narrow portion EP of the first trunk wiring line ELVDDM1' is also formed along the first side H1 of the display region DA is described as an example, but the present embodiment is not limited thereto. The first edge portion DR1 of the display region DA may include an irregular edge other than the first side H1. When the first edge portion DR1 of the display region DA includes the irregular edge, the narrow portion EP of the first trunk wiring line ELVDDM1' is formed along the irregular edge.

As illustrated in FIG. 1, the second trunk wiring line ELVSSM1' is preferably provided in a frame-like shape so as to surround an edge of the display region DA except for at least a part of the edge of the display region DA facing the thick portion CP of the first trunk wiring line ELVDDM1'. Further, the second trunk wiring line ELVSSM1' preferably includes a portion FP formed along the narrow portion EP of the first trunk wiring line ELVDDM1'.

As illustrated in FIG. 1, a voltage of the ELVDD voltage line (first power supply voltage line) is preferably supplied to the thick portion CP of the first trunk wiring line ELVDDM1' through the lead wiring line ELVDDH1 of the ELVDD voltage line extending from each of the terminal TP2 and the terminal TPn-1 of the terminal portion TER, and a voltage of the ELVSS voltage line (second power supply voltage line) is preferably supplied to the second trunk wiring line ELVSSM1' through the lead wiring line ELVSSH1 of the ELVSS voltage line extending from each of the terminal TP1 and the terminal TPn of the terminal portion TER.

Note that, although not illustrated in FIG. 1, a bank (projection) may be provided in the frame region NDA of the display panel PA1 so as to surround the display region DA in a frame-like shape. The bank (projection) surrounding the display region DA in the frame-like shape may include, for example, a first bank formed near the display region DA and a second bank formed farther than the first bank from the display region DA. When the first bank and the second bank are formed, the first bank is preferably formed so as to overlap the second trunk wiring line ELVSSM1', and the second bank is preferably formed outside the second trunk wiring line ELVSSM1'.

As illustrated in FIG. 2, the display device 1 includes the display panel including the display region DA, the display control circuit 30, the data signal line drive circuit 31, the scanning-side drive circuit 32 (also referred to as a scanning signal line drive/light emission control circuit), and the power supply circuit 33.

Various signals Sin including an image signal are supplied from the outside to the display control circuit 30, a signal Scd for controlling data signal lines D1 to Dm is supplied from the display control circuit 30 to the data signal line drive circuit 31, and a signal Scs for controlling scanning signal lines G0 to Gn and light emission control lines E1 to En is supplied from the display control circuit 30 to the scanning-side drive circuit 32.

The power supply circuit 33 supplies an ELVDD voltage to the first trunk wiring line ELVDDM1' through the terminal TP2 and the terminal TPn-1 of the terminal portion TER, and the lead wiring line ELVDDH1 extending from each of the terminal TP2 and the terminal TPn-1 of the terminal portion TER that are illustrated in FIG. 1. Then, as illustrated in FIGS. 1 and 2, the ELVDD voltage is also supplied to each of the plurality of branch wiring lines ELVDDE1 to ELVDDEn through the first trunk wiring line ELVDDM1'. Further, the power supply circuit 33 supplies an ELVSS voltage to the second trunk wiring line ELVSSM1' through the terminal TP1 and the terminal TPn of the terminal portion TER, and the lead wiring line ELVSSH1 extending from each of the terminal TP1 and the terminal TPn of the terminal portion TER that are illustrated in FIG. 1. Furthermore, the power supply circuit 33 also supplies an initialization voltage to a second initialization power supply line Ini (see FIG. 3).

As illustrated in FIG. 2, the display region DA is provided with N×M light-emitting elements X being one light emission unit Pix. Note that, in the present embodiment, a case where the number of the data signal lines D1 to Dm, the number of the branch wiring lines ELVDDE1 to ELVDDEn, and the column number M of the light-emitting elements X being one light emission unit Pix are the same is described as an example, but the present embodiment is not limited thereto. Further, in the present embodiment, a case where the number of the light emission control lines E1 to En and the row number N of the light-emitting elements X being one light emission unit Pix are the same, and the number of the scanning signal lines G0 to Gn is one more than the number of the light emission control lines E1 to En and the row number N of the light-emitting elements X being one light emission unit Pix is described as an example, but the present embodiment is not limited thereto.

Note that, in the display device 1, the data signal line drive circuit 31 is externally attached, and each terminal of the data signal line drive circuit 31 is electrically connected to a terminal other than the terminals TP1, TP2, TPn−1, and TPn of the terminal portion TER.

Further, in the display device 1, the scanning-side drive circuit 32 is formed to be monolithic in the frame region NDA, which is not limited thereto. The scanning-side drive circuit 32 may be formed to be monolithic in the display region DA, or may be divided into the frame region NDA and the display region DA and formed to be monolithic. Furthermore, the scanning-side drive circuit 32 may be externally attached.

Figure 3:
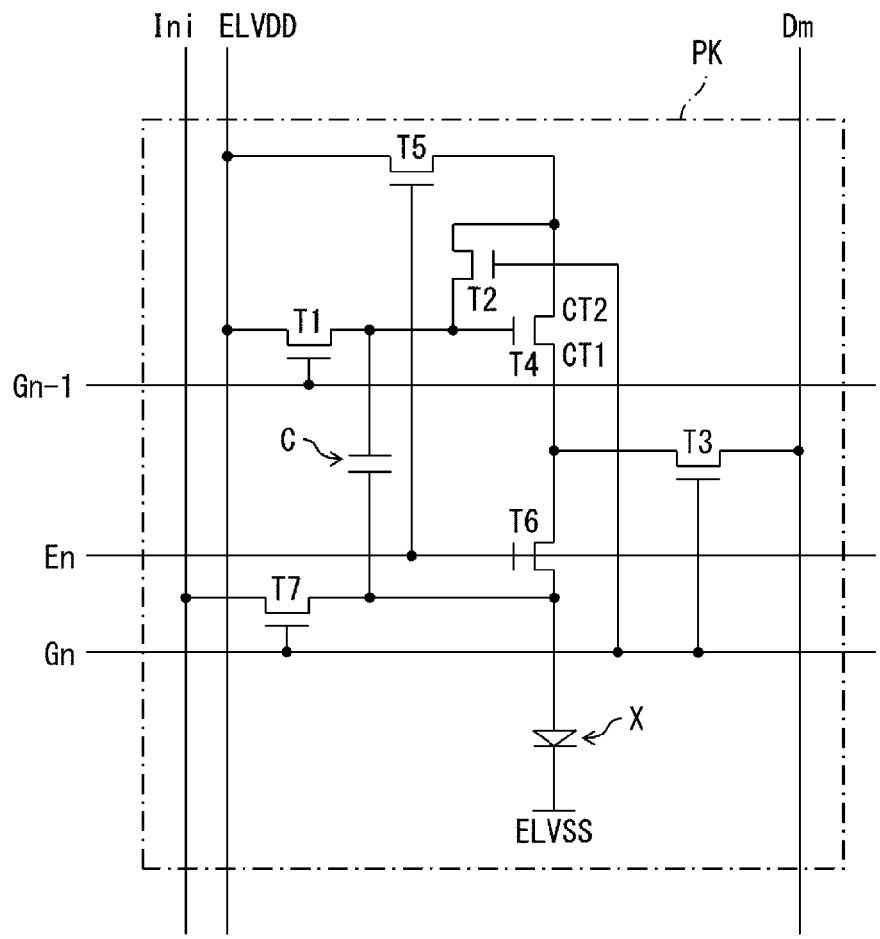
FIG. 3 is a diagram illustrating a configuration example of a pixel circuit of the display device according to the first embodiment illustrated in FIG. 1.

FIG. 3 is a circuit diagram illustrating an example of a pixel circuit PK of the display device 1 illustrated in FIG. 1.

In the display region DA illustrated in FIG. 1, the light-emitting element X and the pixel circuit PK of the light-emitting element X are provided for each subpixel being one light emission unit. The pixel circuit PK illustrated in FIG. 3 is a (n,m)-th pixel circuit PK, but also includes a part of a (n−1,m)-th pixel circuit.

The pixel circuit PK illustrated in FIG. 3 includes: a capacitance element C; a first initialization transistor T1 connected between an ELVDD voltage line ELVDD (specifically, the branch wiring line ELVDDEn) and a control terminal of a drive transistor T4 and having a gate terminal connected to the scanning signal line Gn−1 of a preceding stage ((n−1)-th stage); a threshold value control transistor T2 connected between a second conduction terminal CT2 and the control terminal of the drive transistor T4 and having a gate terminal connected to the scanning signal line Gn of an own stage (n-th stage); a writing control transistor T3 connected between the data signal line Dm and a first conduction terminal CT1 of the drive transistor T4 and having a gate terminal connected to the scanning signal line Gn of the own stage (n-th stage); the drive transistor T4 configured to control a current of the light-emitting element X; a power supply transistor T5 connected between the ELVDD voltage line ELVDD (specifically, the branch wiring line ELVDDEn) and the second conduction terminal CT2 of the drive transistor T4 and having a gate terminal connected to the light emission control line En; a light emission control transistor T6 connected between the first conduction terminal CT1 of the drive transistor T4 and a first electrode of the light-emitting element X and having a gate terminal connected to the light emission control line En; and a second initialization transistor T7 connected between the second initialization power supply line Ini and the first electrode of the light-emitting element X and having a gate terminal connected to the scanning signal line Gn of the own stage (n-th stage).

Note that, in the present embodiment, a case where the ELVDD voltage line ELVDD (specifically, the branch wiring line ELVDDEn) also serves as a first initialization power supply line is described as an example, but the present embodiment is not limited thereto. The first initialization power supply line and the ELVDD voltage line ELVDD (specifically, the branch wiring line ELVDDEn) may be separately provided.

Further, in the present embodiment, a voltage identical to an ELVSS voltage line ELVSS is input to the second initialization power supply line Ini, but the present embodiment is not limited thereto. A different voltage, with which the light-emitting element X is turned off, may be input.

The capacitance element C is connected to the control terminal of the drive transistor T4, and holds a data signal in the data signal line Dm. Note that the second initialization transistor T7 may be connected to the scanning signal line Gn−1 of the preceding stage ((n−1)-th stage).

Figure 4:
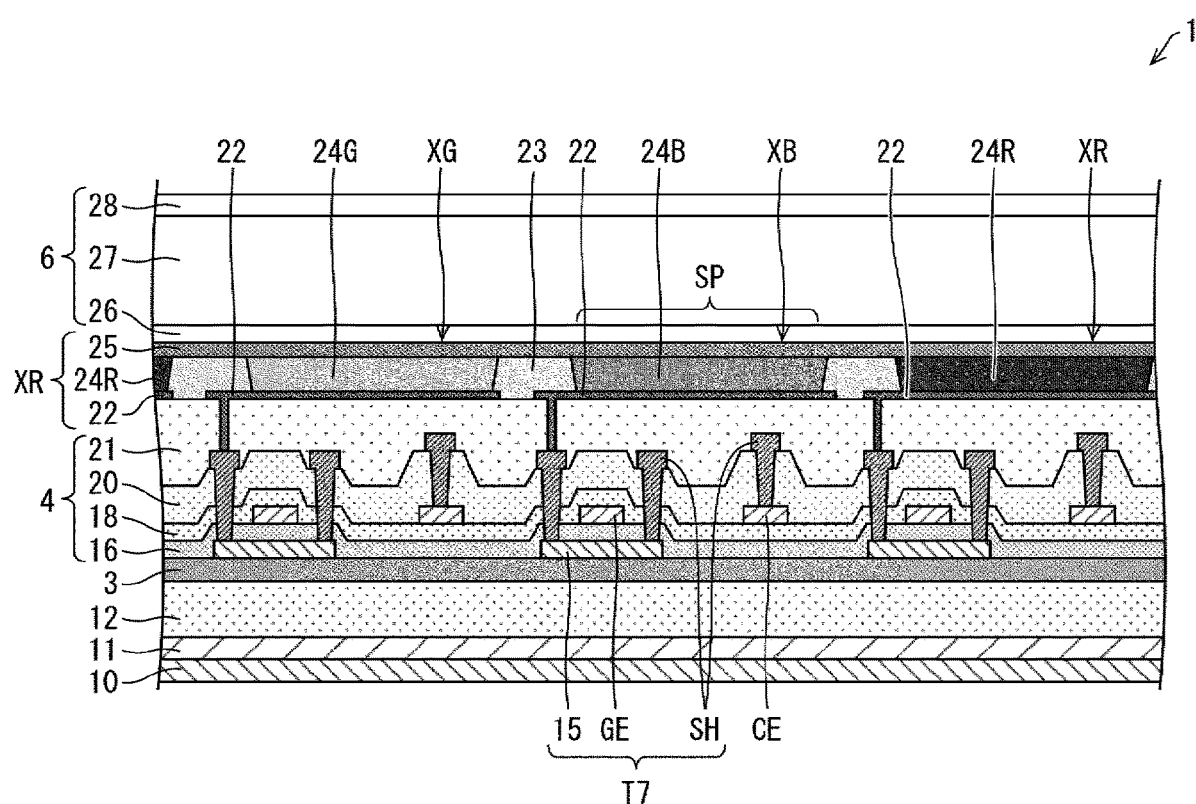
FIG. 4 is a cross-sectional view illustrating a general configuration of the display device according to the first embodiment.

FIG. 4 is a cross-sectional view illustrating a general configuration of the display region DA of the display device 1.

As illustrated in FIG. 4, in the display region DA of the display device 1, an adhesive layer 11, a resin layer 12, a barrier layer 3, a thin film transistor layer (TFT layer) 4, the light-emitting element X (a light-emitting element XR that emits a red color, a light-emitting element XG that emits a green color, and a light-emitting element XB that emits a blue color), and a sealing layer 6 are included in this order on a base substrate 10.

An example of the material of the base substrate 10 includes polyethylene terephthalate (PET), but the material is not limited thereto.

Examples of the adhesive layer 11 include an optical clear adhesive (OCA) or an optical clear resin (OCR), but are not limited thereto.

Examples of the material of the resin layer 12 include a polyimide resin, an epoxy resin, and a polyamide resin, but are not limited thereto.

The barrier layer 3 is a layer configured to prevent moisture or impurities from reaching, for example, various transistors, such as the second initialization transistor T7, and the light-emitting element X (the light-emitting element XR that emits the red color, the light-emitting element XG that emits the green color, and the light-emitting element XB that emits the blue color), and can be formed of, for example, a silicon oxide film, a silicon nitride film, a silicon oxynitride film, or a layered film of these films that are formed by using CVD.

The transistor, such as the second initialization transistor T7, and the capacitance element are provided as an upper layer overlying the resin layer 12 and the barrier layer 3. The thin film transistor layer 4 including the transistor, such as the second initialization transistor T7, and the capacitance element includes a semiconductor film 15, an inorganic insulating film (gate insulating film) 16 as an upper layer overlying the semiconductor film 15, a gate electrode GE as an upper layer overlying the inorganic insulating film 16, an inorganic insulating film (first insulating film) 18 as an upper layer overlying the gate electrode GE, a counter electrode CE of the capacitance element as an upper layer overlying the inorganic insulating film 18, an inorganic insulating film (second insulating film) 20 as an upper layer overlying the counter electrode CE of the capacitance element, a layer SH forming a source electrode, a drain electrode, and a wiring line of the source and drain electrodes and being an upper layer overlying the inorganic insulating film 20, and an interlayer insulating film 21 as an upper layer overlying the layer SH forming the source electrode, the drain electrode, and the wiring line.

Note that the capacitance element is formed of the counter electrode CE of the capacitance element formed directly above the inorganic insulating film 18, the inorganic insulating film 18, and a capacitance electrode formed directly below the inorganic insulating film 18 and formed overlapping the counter electrode CE of the capacitance element in the same layer as the layer forming the gate electrode GE.

The transistor such as the second initialization transistor T7 is formed so as to include the semiconductor film 15, the inorganic insulating film 16, the gate electrode GE, the inorganic insulating film 18, the inorganic insulating film 20, the source electrode, and the drain electrode.

The semiconductor film 15 is formed of low-temperature polysilicon (LTPS) or an oxide semiconductor, for example.

The gate electrode GE, the counter electrode CE of the capacitance element, the layer SH forming the source electrode, the drain electrode, and the wiring line of the source and drain electrodes are formed of, for example, a single layer film or a layered film of a metal including at least one of aluminum (Al), tungsten (W), molybdenum (Mo), tantalum (Ta), chromium (Cr), titanium (Ti), copper (Cu), and silver (Ag).

The inorganic insulating films 16, 18, and 20 may be formed of, for example, a silicon oxide (SiOx) film, a silicon nitride (SiNx) film, or a silicon oxynitride film, or of a layered film of these, formed by CVD.

The interlayer insulating film 21 may be formed of, for example, a coatable photosensitive organic material, such as a polyimide resin, an acrylic resin, or the like.

The light-emitting element XR that emits the red color includes a first electrode 22 as an upper layer overlying the interlayer insulating film 21, a function layer 24R including a red light-emitting layer as an upper layer overlying the first electrode 22, and a second electrode 25 as an upper layer overlying the function layer 24R. The light-emitting element XG that emits the green color includes the first electrode 22 as an upper layer overlying the interlayer insulating film 21, a function layer 24G including a green light-emitting layer as an upper layer overlying the first electrode 22, and the second electrode 25 as the upper layer overlying the function layer 24G. The light-emitting element XB that emits the blue color includes the first electrode 22 as an upper layer overlying the interlayer insulating film 21, a function layer 24B including a blue light-emitting layer as an upper layer overlying the first electrode 22, and the second electrode 25 as the upper layer overlying the function layer 24B.

An edge cover (bank) 23 covering an edge of the first electrode 22 is formed on the interlayer insulating film 21.

A subpixel SP that displays the red color includes the light-emitting element XR, and thus includes the function layer 24R including the red light-emitting layer. The subpixel SP that displays the green color includes the light-emitting element XG, and thus includes the function layer 24G including the green light-emitting layer. The subpixel SP that displays the blue color includes the light-emitting element XB, and thus includes the function layer 24B including the blue light-emitting layer.

In the display device 1, the first electrode 22 having an island shape, each of the function layers 24R, 24G, and 24B including the light-emitting layer of each color, and the second electrode 25 are included for each subpixel SP. The edge cover 23 can be formed of, for example, a coatable photosensitive organic material such as a polyimide resin or an acrylic resin.

The function layers 24R, 24G, and 24B are formed by layering a hole injection layer, a hole transport layer, a light-emitting layer, an electron transport layer, and an electron injection layer in an order from a lower layer side, for example. The light-emitting layer is formed in an island shape for each subpixel SP by vapor deposition or an ink-jet method, but the other layers can also be configured as solid-like common layers. Further, it is also possible to adopt a configuration in which one or more layers of the hole injection layer, the hole transport layer, the electron transport layer, and the electron injection layer are not formed.

The light-emitting elements XR, XG, and XB each may be, for example, an organic light-emitting diode (OLED) including an organic layer as the light-emitting layer, or may be a quantum dot light-emitting diode (QLED) including a quantum dot layer as the light-emitting layer.

The first electrode 22 is formed by layering Indium Tin Oxide (ITO) and an alloy including Ag, for example, but is not particularly limited as long as electrical conductivity and light reflectivity can be ensured. Further, the second electrode 25 can be formed of a light-transmitting conductive material such as Indium Tin Oxide (ITO) and Indium Zinc Oxide (IZO), but is not particularly limited as long as electrical conductivity and light-transmitting property can be ensured. Note that, in the present embodiment, a case where the light-emitting elements XR, XG, and XB are a top-emitting type is described as an example, but the present embodiment is not limited thereto. The light-emitting elements XR, XG, and XB may be a bottom-emitting type, and in this case, the first electrode 22 is formed of a light-transmitting conductive material and the second electrode 25 is formed of a conductive material having light reflectivity.

The first electrode 22 is provided for each subpixel SP, and is electrically connected to the drain electrode of the second initialization transistor T7. Further, the second electrode 25 is provided in common with all of the subpixels SP. Further, the second initialization transistor T7 is driven for each subpixel SP. Note that the second electrode 25 provided in common with all of the subpixels SP is electrically connected to the second trunk wiring line ELVSSM1' of the ELVSS voltage line illustrated in FIG. 1.

The sealing layer 6 is a light transmissive layer, and includes a first inorganic sealing film 26 that covers the second electrode 25, an organic sealing film 27 that is formed on a side above the first inorganic sealing film 26, and a second inorganic sealing film 28 that covers the organic sealing film 27. The sealing layer 6 covering the light-emitting elements XR, XG, and XB inhibits foreign matters such as water and oxygen from penetrating into the light-emitting elements XR, XG, and XB.

Each of the first inorganic sealing film 26 and the second inorganic sealing film 28 may be constituted by, for example, a silicon oxide film, a silicon nitride film, or a silicon oxynitride film, or a layered film of these films formed by CVD. The organic sealing film 27 is a light transmissive organic film which is thicker than the first inorganic sealing film 26 and the second inorganic sealing film 28, and can be formed of a coatable photosensitive organic material such as a polyimide resin or an acrylic resin.

In the present embodiment, the sealing layer 6 formed of a single-layered organic film and a two-layered inorganic film and including the organic sealing film 27 between the first inorganic sealing film 26 and the second inorganic sealing film 28 has been described as an example, but the present embodiment is not limited thereto. The sealing layer 6 may be formed of only an inorganic film formed of one or more layers or an organic film formed of one or more layers, or may be formed of an inorganic film formed of two or more layers or an organic film formed of two or more layers.

In the present embodiment, a case where the display device 1 is a flexible display device, and the base substrate 10 being a flexible substrate is bonded to the resin layer 12 via the adhesive layer 11 has been described as an example, but the present embodiment is not limited thereto. For example, a step of bonding the base substrate 10 being the flexible substrate via the adhesive layer 11 may be omitted, and the resin layer 12 may be used as a flexible substrate as it is. Further, the display device 1 may be a non-flexible display device, and in this case, for example, the base substrate 10, the adhesive layer 11, and the resin layer 12 may be omitted, and the barrier layer 3 may be directly formed on a glass substrate being a non-flexible substrate.

As described above, the display device 1 can achieve frame narrowing in the frame region NDA provided with the narrow portion EP of the first trunk wiring line ELVDDM1'.

Note that a first portion of the first trunk wiring line ELVDDM1' refers to a part of the narrow portion EP of the first trunk wiring line ELVDDM1' illustrated in FIG. 1. Further, a portion of the first trunk wiring line ELVDDM1' including the first portion, which is formed along the extension direction of the first side H1, refers to the narrow portion EP itself of the first trunk wiring line ELVDDM1', and the first portion of the first trunk wiring line ELVDDM1' is included in the narrow portion EP of the first trunk wiring line ELVDDM1'.

Meanwhile, a second portion of the first trunk wiring line ELVDDM1' refers to a part of the thick portion CP of the first trunk wiring line ELVDDM1'. Then, when the line width of the thick portion CP is not fixed, the second portion refers to a portion of the thick portion CP having the greatest line width. Further, a straight portion of the first trunk wiring line ELVDDM1' formed along the first side H1 refers to the thick portion CP itself of the first trunk wiring line ELVDDM1', and the second portion of the first trunk wiring line ELVDDM1' is included in the thick portion CP of the first trunk wiring line ELVDDM1'. Note that, in the present embodiment, a case where the line width of the straight portion of the first trunk wiring line ELVDDM1' is fixed has been described as an example, but the present embodiment is not limited thereto. As long as a center line of the straight portion in the extension direction of the branch wiring lines ELVDDE1 to ELVDDEn is formed along the extension direction of the first side H1, the straight portion also includes a shape in which a line width of a thick portion CP of a first trunk wiring line ELVDDM8' decreases with decreasing distance from a narrow portion EP of the first trunk wiring line ELVDDM8' as in a case of, for example, a display device 1e (see FIG. 11) according to a sixth embodiment described below.

Furthermore, a third portion of the second trunk wiring line ELVSSM1' refers to the portion FP itself in the second trunk wiring line ELVSSM1', which is formed along the narrow portion EP of the first trunk wiring line ELVDDM1'.

Second Embodiment

Next, with reference to FIG. 5, a second embodiment of the disclosure will be described. A display device 1a according to the present embodiment is different from the first embodiment in that an ELVDD voltage line (first power supply voltage line) includes a first trunk wiring line ELVDDM2' and branch wiring lines ELVDDE1 to ELVDDEn and further includes a third trunk wiring line ELVDDM3', and a point that a line width of a narrow portion EP of the first trunk wiring line ELVDDM2' is fixed, and other points are as described above in the first embodiment. For convenience of explanation, components having the same functions as those described in diagrams of the first embodiment are appended with the same reference signs, and descriptions thereof may be omitted.

Figure 5:
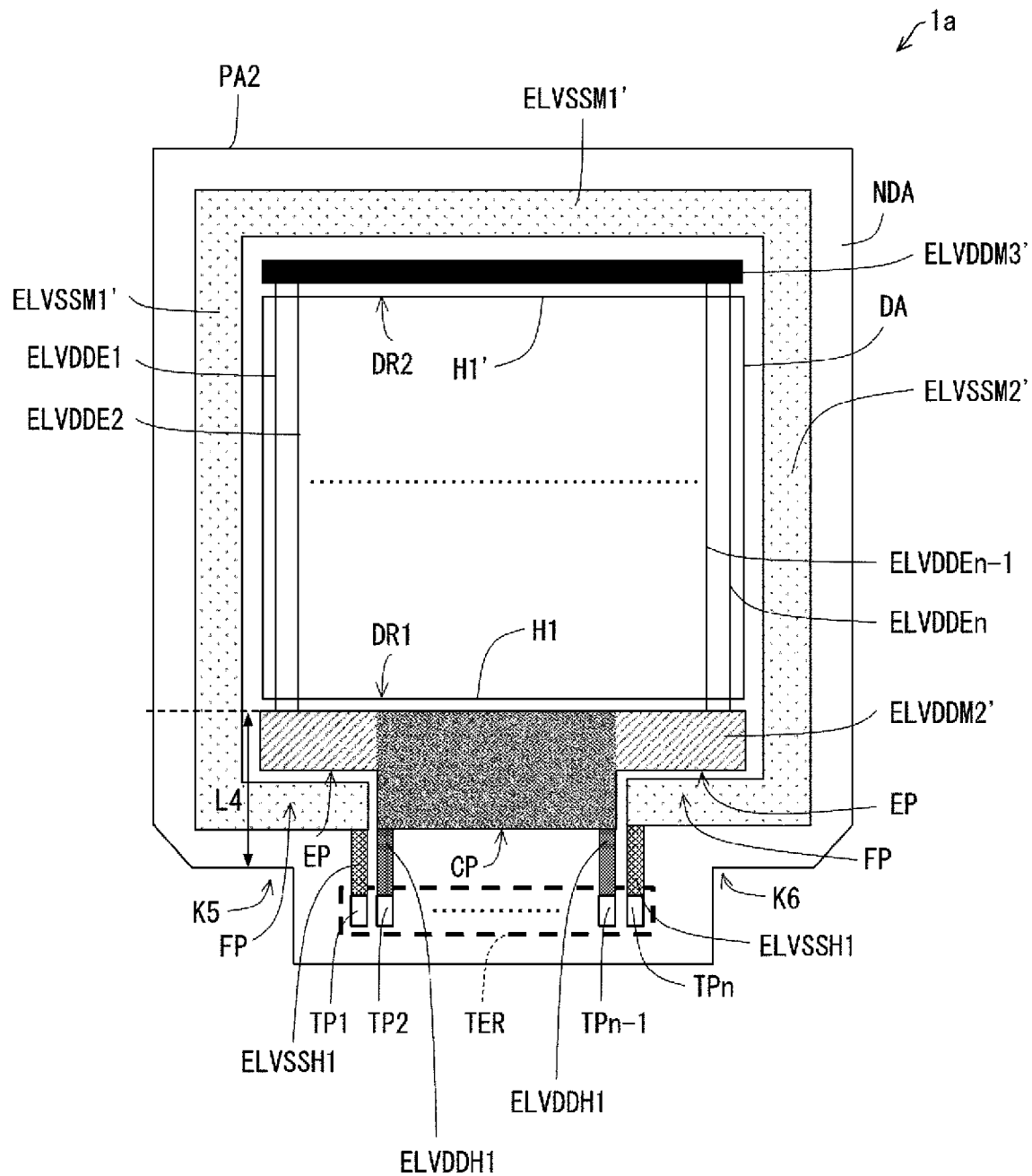
FIG. 5 is a schematic plan view illustrating a general configuration of a display device according to a second embodiment.

FIG. 5 is a schematic plan view illustrating a general configuration of the display device 1a including a display panel PA2 according to the second embodiment.

As illustrated in FIG. 5, the ELVDD voltage line (first power supply voltage line) includes the first trunk wiring line ELVDDM2', the branch wiring lines ELVDDE1 to ELVDDEn, and the third trunk wiring line ELVDDM3'.

The first trunk wiring line ELVDDM2' is provided in a frame region NDA along a first edge portion DR1 of a display region DA including a first side H1 facing a terminal portion TER. Note that, since the display device 1a illustrated in FIG. 5 includes the rectangle display region DA, the first side H1 of the display region DA facing the terminal portion TER and the first edge portion DR1 of the display region DA are the same. Meanwhile, the third trunk wiring line ELVDDM3' is provided in the frame region NDA along a second edge portion DR2 of the display region DA including a second side H1' facing the first side H1 across the display region DA. Note that, since the display device 1a illustrated in FIG. 5 includes the rectangle display region DA, the second side H1' of the display region DA and the second edge portion DR2 of the display region DA are the same. Each of the branch wiring lines ELVDDE1 to ELVDDEn is electrically connected to the first trunk wiring line ELVDDM2' and the third trunk wiring line ELVDDM3', and extends from the third trunk wiring line ELVDDM3' to the first trunk wiring line ELVDDM2' in a direction intersecting the first edge portion DR1 and the second edge portion DR2, and is provided in the frame region NDA and the display region DA.

As illustrated in FIG. 5, the first trunk wiring line ELVDDM2' includes the narrow portion EP connected to some of the branch wiring lines (for example, ELVDDE1, ELVDDE2, ELVDDEn-1, ELVDDEn, and the like) intersecting an end portion of the first edge portion DR1 among the plurality of branch wiring lines ELVDDE1 to ELVDDEn, and includes a thick portion CP connected to some other of the branch wiring lines intersecting a central portion of the first edge portion DR1 among the plurality of branch wiring lines ELVDDE1 to ELVDDEn. Note that the line width of the narrow portion EP of the first trunk wiring line ELVDDM2' in an extension direction of the branch wiring lines ELVDDE1 to ELVDDEn is smaller than a line width of the thick portion CP of the first trunk wiring line ELVDDM2' in the extension direction of the branch wiring lines ELVDDE1 to ELVDDEn.

In the display panel PA2 illustrated in FIG. 5, a current flows through the entire surface of the display region DA, and thus a central portion of the first trunk wiring line ELVDDM2' that is electrically connected to two lead wiring lines ELVDDH1 and needs a relatively thick line width is the thick portion CP of the first trunk wiring line ELVDDM2'. Meanwhile, the number of the branch wiring lines as a target through which a current flows decreases with decreasing distance from the end portion of the first edge portion DR1 of the display region DA. Thus, a current flowing through the first trunk wiring line ELVDDM2' corresponding to the end portion of the first edge portion DR1 of the display region DA decreases. Therefore, the line width of the narrow portion EP of the first trunk wiring line ELVDDM2' can be made smaller than the line width of the thick portion CP of the first trunk wiring line ELVDDM2'. Note that, in the present embodiment, the line width of the narrow portion EP of the first trunk wiring line ELVDDM2' is fixed, but the present embodiment is not limited thereto.

Unlike a known manner, the first trunk wiring line ELVDDM2' does not have a rectangular shape (see (a) of FIG. 12 and (b) of FIG. 12) in which a line width of the central portion and the portion having a concentrated current and being connected to the lead wiring line ELVDDH1, which need a relatively thick line width, remains as it is even in the end portion. As illustrated in FIG. 5, the first trunk wiring line ELVDDM2' has a shape with, as the thick portion CP, only the central portion and the portion having a concentrated current and being connected to the lead wiring line ELVDDH1, which need a relatively thick line width, and with the narrow portion EP on both ends of the thick portion CP. Note that, because a current concentrates in the portion connected to the lead wiring line ELVDDH1, for example, similarly to the thick portion CP of the first trunk wiring line ELVDDM4' included in the display device 1b illustrated in FIG. 6 according to the third embodiment described below, and the thick portion CP of the first trunk wiring line ELVDDM6' included in the display device 1d illustrated in FIG. 9 according to the fifth embodiment described below, it is preferable that a width of the thick portion CP of the first trunk wiring lines ELVDDM4' and ELVDDM6' in the extension direction of the first side H1 is greater than a width acquired by combining a width of the two lead wiring lines ELVDDH1 in the extension direction of the first side H1 and a width between the two lead wiring lines ELVDDH1 in the extension direction of the first side H1.

A voltage of the ELVDD voltage line (first power supply voltage line) is preferably supplied to the thick portion CP of the first trunk wiring line ELVDDM2' through the lead wiring line ELVDDH1 of the ELVDD voltage line (first power supply voltage line) extending from the terminal portion TER.

In the frame region NDA provided with the narrow portion EP of the first trunk wiring line ELVDDM2', the line width of the narrow portion EP in the extension direction of the branch wiring lines ELVDDE1 to ELVDDEn is smaller than the line width of the thick portion CP in the extension direction of the branch wiring lines ELVDDE1 to ELVDDEn, and thus a distance L4 from an edge of the first trunk wiring line ELVDDM2' on the display region DA side to edges K5 and K6 of the frame region NDA in the extension direction of the branch wiring lines ELVDDE1 to ELVDDEn can be reduced. The distance L4 is formed of the line width of the narrow portion EP of the first trunk wiring line ELVDDM2', a distance for ensuring insulation between the narrow portion EP of the first trunk wiring line ELVDDM2' and a second trunk wiring line ELVSSM2', a line width of the second trunk wiring line ELVSSM2', and a minimum margin width between the second trunk wiring line ELVSSM2' and the edges K5 and K6 of the frame region NDA. Note that a portion other than the line width of the narrow portion EP of the first trunk wiring line ELVDDM2' included in the distance L4 can be made similar to that of the known configuration (see (a) of FIG. 12 and (b) of FIG. 12).

As illustrated in FIG. 5, in the display device 1a including the display panel PA2, the edge of the frame region NDA provided with the narrow portion EP of the first trunk wiring line ELVDDM2' includes the first irregular frame edges K5 and K6 having an irregular shape. Note that the first irregular frame edges K5 and K6 are edges in which a width of at least a part of the frame region NDA provided with the narrow portion EP of the first trunk wiring line ELVDDM2' in the extension direction of the branch wiring lines ELVDDE1 to ELVDDEn is formed to be smaller than a width of the frame region NDA provided with the thick portion CP of the first trunk wiring line ELVDDM2' in the extension direction of the branch wiring lines ELVDDE1 to ELVDDEn.

Further, the second trunk wiring line ELVSSM2' preferably includes a portion (third portion) FP formed along the narrow portion EP of the first trunk wiring line ELVDDM2'.

As described above, the display device 1a including the display panel PA2 can achieve frame narrowing in the frame region NDA provided with the narrow portion EP of the first trunk wiring line ELVDDM2'.

Third Embodiment

Next, with reference to FIGS. 6 and 7, the third embodiment of the disclosure will be described. The display device 1b according to the present embodiment is different from the first and second embodiments in that both ends of a first edge portion DR1 of a display region DA2 are formed of a third side H4 different from the first side H1 of the display region DA2 facing a terminal portion TER, and a point that a third trunk wiring line ELVDDM5' includes a narrow portion EP and a thick portion CP, and other points are as described above in the first and second embodiments. For the sake of the description, members having the same functions as the members illustrated in the diagrams in the first and second embodiments are denoted by the same reference numerals, and descriptions thereof will be omitted.

Figure 6:
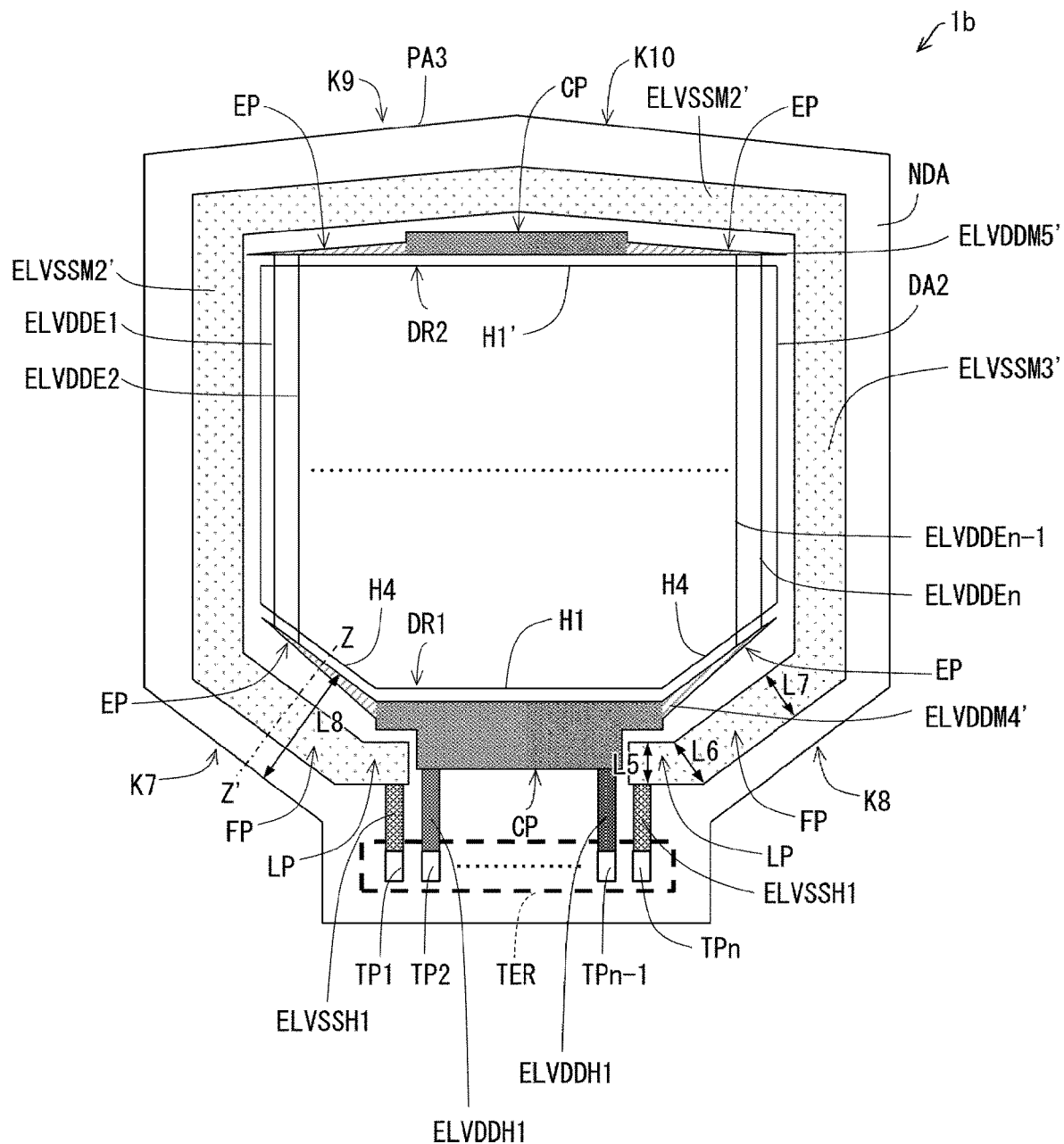
FIG. 6 is a schematic plan view illustrating a general configuration of a display device according to a third embodiment.

FIG. 6 is a schematic plan view illustrating a general configuration of the display device 1b including a display panel PA3 according to the third embodiment.

As illustrated in FIG. 6, an ELVDD voltage line (first power supply voltage line) includes the first trunk wiring line ELVDDM4', branch wiring lines ELVDDE1 to ELVDDEn, and the third trunk wiring line ELVDDM5'.

The first trunk wiring line ELVDDM4' is provided in a frame region NDA along the first edge portion DR1 of the display region DA2 formed of the first side H1 facing the terminal portion TER and the two third sides H4 formed so as to sandwich the first side H1. In the display panel PA3, both ends of the first edge portion DR1 of the display region DA2 are formed of the third sides H4, and form an inclined edge being an irregular edge. Meanwhile, the third trunk wiring line ELVDDM5' is provided in the frame region NDA along a second edge portion DR2 of the display region DA2 including a second side H1' facing the first side H1. Each of the branch wiring lines ELVDDE1 to ELVDDEn is electrically connected to the first trunk wiring line ELVDDM4' and the third trunk wiring line ELVDDM5', extends from the third trunk wiring line ELVDDM5' to the first trunk wiring line ELVDDM4' in a direction intersecting the first edge portion DR1 and the second edge portion DR2, and is provided in the frame region NDA and the display region DA2.

As illustrated in FIG. 6, the first trunk wiring line ELVDDM4' includes a narrow portion EP connected to some of the branch wiring lines (for example, ELVDDE1, ELVDDE2, ELVDDEn−1, ELVDDEn, and the like) intersecting an end portion of the first edge portion DR1 among the plurality of branch wiring lines ELVDDE1 to ELVDDEn, and includes a thick portion CP connected to some other of the branch wiring lines intersecting a central portion of the first edge portion DR1 among the plurality of branch wiring lines ELVDDE1 to ELVDDEn. Note that a line width of the narrow portion EP of the first trunk wiring line ELVDDM4' in a direction orthogonal to the third side H4 is smaller than a line width of the thick portion CP of the first trunk wiring line ELVDDM4' in an extension direction of the branch wiring lines ELVDDE1 to ELVDDEn.

In the display panel PA3 illustrated in FIG. 6, a current flows through the entire surface of the display region DA2, and thus a central portion of the first trunk wiring line ELVDDM4' that is electrically connected to the two lead wiring lines ELVDDH1 and needs a relatively thick line width is the thick portion CP of the first trunk wiring line ELVDDM4'. Meanwhile, the number of subpixels and the branch wiring lines that are a target through which a current flows decreases with decreasing distance from the end portion of the first edge portion DR1 of the display region DA2. Thus, a current flowing through the first trunk wiring line ELVDDM4' corresponding to the end portion of the first edge portion DR1 of the display region DA2 decreases. Therefore, the line width of the narrow portion EP of the first trunk wiring line ELVDDM4' in the direction orthogonal to the third side H4 can be made smaller than the line width of the thick portion CP of the first trunk wiring line ELVDDM4' in the extension direction of the branch wiring lines ELVDDE1 to ELVDDEn.

As illustrated in FIG. 6, a length in the display region DA2 of some of the branch wiring lines (for example, ELVDDE1, ELVDDE2, ELVDDEn-1, ELVDDEn, and the like) intersecting the third side H4 of the first edge portion DR1 of the display region DA2 among the branch wiring lines ELVDDE1 to ELVDDEn is shorter than a length in the display region DA2 of some other of the branch wiring lines intersecting the first side H1 of the first edge portion DR1 of the display region DA2 among the branch wiring lines ELVDDE1 to ELVDDEn.

The thick portion CP of the first trunk wiring line ELVDDM4' is a straight portion formed along the first side H1 of the first edge portion DR1 of the display region DA2. The narrow portion EP of the first trunk wiring line ELVDDM4' is an inclined portion formed along the third side H4 of the first edge portion DR1 of the display region DA2 forming the inclined edge of the display region DA2.

In the present embodiment, the line width of the narrow portion EP of the first trunk wiring line ELVDDM4' in the direction orthogonal to the third side H4 decreases with increasing distance from a boundary between the narrow portion EP of the first trunk wiring line ELVDDM4' and the thick portion CP of the first trunk wiring line ELVDDM4', but the present embodiment is not limited thereto. For example, the line width of the narrow portion EP of the first trunk wiring line ELVDDM4' in the direction orthogonal to the third side H4 may be fixed as long as the line width of the narrow portion EP of the first trunk wiring line ELVDDM4' in the direction orthogonal to the third side H4 is smaller than the line width of the thick portion CP of the first trunk wiring line ELVDDM4' in the extension direction of the branch wiring lines ELVDDE1 to ELVDDEn.

Further, in the present embodiment, the line width of the thick portion CP of the first trunk wiring line ELVDDM4' at the boundary with the narrow portion EP of the first trunk wiring line ELVDDM4' in the extension direction of the branch wiring lines ELVDDE1 to ELVDDEn is set smaller than a line width of a portion of the thick portion CP of the first trunk wiring line ELVDDM4' facing a central portion of the first side H1 in the extension direction of the branch wiring lines ELVDDE1 to ELVDDEn, but the present embodiment is not limited thereto. For example, the line width of the thick portion CP of the first trunk wiring line ELVDDM4' in the extension direction of the branch wiring lines ELVDDE1 to ELVDDEn may be fixed, or the line width of the thick portion CP of the first trunk wiring line ELVDDM4' in the extension direction of the branch wiring lines ELVDDE1 to ELVDDEn may be set smaller with decreasing distance from the narrow portion EP of the first trunk wiring line ELVDDM4', as long as the line width of the narrow portion EP of the first trunk wiring line ELVDDM4' in the direction orthogonal to the third side H4 is smaller than the line width of the thick portion CP of the first trunk wiring line ELVDDM4' in the extension direction of the branch wiring lines ELVDDE1 to ELVDDEn.

A second trunk wiring line ELVSSM3' is preferably provided in a frame-like shape so as to surround the edge of the display region DA2 except for the edge of the display region DA2 facing the thick portion CP of the first trunk wiring line ELVDDM4', i.e., except for at least a part of the first side H1 of the first edge portion DR1 of the display region DA2.

The second trunk wiring line ELVSSM3' preferably includes a portion FP (third portion) formed along the narrow portion EP of the first trunk wiring line ELVDDM4'.

The second trunk wiring line ELVSSM3' preferably further includes a straight portion LP (fourth portion) that is connected to the portion FP (third portion) formed along the narrow portion EP of the first trunk wiring line ELVDDM4', and extends in the same direction as an extension direction of the first side H1.

In the present embodiment, in the second trunk wiring line ELVSSM3', the portion FP (third portion) formed along the narrow portion EP of the first trunk wiring line ELVDDM4' is an inclined portion (a portion inclined at a predetermined angle with respect to the extension direction of the first side H1), and the portion LP (fourth portion) extending in the same direction as the extension direction of the first side H1 is a straight portion.

Note that, in the second trunk wiring line ELVSSM3', a line width L5, in the extension direction of the branch wiring lines ELVDDE1 to ELVDDEn, of the straight portion LP (fourth portion) extending in the same direction as the extension direction of the first side H1 is preferably equal to a line width L6, in the direction orthogonal to the third side H4, of the straight portion LP (fourth portion) extending in the same direction as the extension direction of the first side H1 at a boundary with the portion FP (third portion) formed along the narrow portion EP of the first trunk wiring line ELVDDM4'.

Further, in the second trunk wiring line ELVSSM3', the line width L5, in the extension direction of the branch wiring lines ELVDDE1 to ELVDDEn, of the straight portion LP (fourth portion) extending in the same direction as the extension direction of the first side H1 is preferably equal to a line width L7, in the direction orthogonal to the third side H4, of the portion FP (third portion) formed along the narrow portion EP of the first trunk wiring line ELVDDM4'.

Unlike a known manner, the first trunk wiring line ELVDDM4' does not have a rectangular shape (see (a) of FIG. 12 and (b) of FIG. 12) in which a line width of the central portion and the portion having a concentrated current and being connected to the lead wiring line ELVDDH1, which need a relatively thick line width, remains as it is even in the end portion. As illustrated in FIG. 6, the first trunk wiring line ELVDDM4' has a shape with, as the thick portion CP, only the central portion and the peripheral portion having a concentrated current and being connected to the lead wiring line ELVDDH1, which need a relatively thick line width, and with the narrow portion EP on both ends of the thick portion CP. In the present embodiment, as illustrated in FIG. 6, from a point that the current is concentrated in a portion to which the lead wiring line ELVDDH1 is connected, the peripheral portion in which the current is concentrated and to which the lead wiring line ELVDDH1 is connected is also the thick portion CP. Therefore, a width, in the extension direction of the first side H1, of the thick portion CP of the first trunk wiring line ELVDDM4' included in the display device 1b illustrated in FIG. 6 is greater than a width acquired by combining a width of the two lead wiring lines ELVDDH1 in the extension direction of the first side H1 and a width between the two lead wiring lines ELVDDH1 in the extension direction of the first side H1.

A voltage of the ELVDD voltage line (first power supply voltage line) is preferably supplied to a second portion being a portion having the greatest line width in the thick portion CP of the first trunk wiring line ELVDDM4' through the lead wiring line ELVDDH1 of the ELVDD voltage line (first power supply voltage line) extending from the terminal portion TER.

In the frame region NDA provided with the narrow portion EP of the first trunk wiring line ELVDDM4', the line width of the narrow portion EP is smaller than the line width of the thick portion CP, and thus a distance L8 from an edge of the first trunk wiring line ELVDDM4' on the display region DA2 side to edges K7 and K8 of the frame region NDA in the direction orthogonal to the third side H4 can be reduced. The distance L8 is formed of the line width of the narrow portion EP of the first trunk wiring line ELVDDM4', a distance for ensuring insulation between the narrow portion EP of the first trunk wiring line ELVDDM4' and the second trunk wiring line ELVSSM3', a line width of the second trunk wiring line ELVSSM3', and a minimum margin width between the second trunk wiring line ELVSSM3' and the edges K7 and K8 of the frame region NDA. Note that a portion other than the line width of the narrow portion EP of the first trunk wiring line ELVDDM4' included in the distance L8 from the edge of the first trunk wiring line ELVDDM4' on the display region DA2 side to the edges K7 and K8 of the frame region NDA in the direction orthogonal to the third side H4 can be made similar to that of the known configuration (see (a) of FIG. 12 and (b) of FIG. 12).

As illustrated in FIG. 6, in the display device 1b including the display panel PA3, an edge of the frame region NDA provided with the narrow portion EP of the first trunk wiring line ELVDDM4' includes the first irregular frame edges K7 and K8. Note that the first irregular frame edges K7 and K8 are edges in which a width of at least a part of the frame region NDA provided with the narrow portion EP of the first trunk wiring line ELVDDM4' is formed to be smaller than a width of the frame region NDA provided with the thick portion CP of the first trunk wiring line ELVDDM4'.

As illustrated in FIG. 6, the third trunk wiring line ELVDDM5' includes the narrow portion EP connected to some of the branch wiring lines (for example, ELVDDE1, ELVDDE2, ELVDDEn−1, ELVDDEn, and the like) intersecting an end portion of the second edge portion DR2 among the branch wiring lines ELVDDE1 to ELVDDEn, and includes the thick portion CP connected to some other of the branch wiring lines intersecting a central portion of the second edge portion DR2 among the branch wiring lines ELVDDE1 to ELVDDEn. The line width of the narrow portion EP of the third trunk wiring line ELVDDM5' in the extension direction of the branch wiring lines ELVDDE1 to ELVDDEn is smaller than a line width of the thick portion CP of the third trunk wiring line ELVDDM5' in the extension direction of the branch wiring lines ELVDDE1 to ELVDDEn. The edge of the frame region NDA provided with the narrow portion EP of the third trunk wiring line ELVDDM5' includes second irregular frame edges K9 and K10. Note that the second irregular frame edges K9 and K10 are edges in which a width of at least a part of the frame region NDA provided with the narrow portion EP of the third trunk wiring line ELVDDM5' is formed to be smaller than a width of the frame region NDA provided with the thick portion CP of the third trunk wiring line ELVDDM5'.

As described above, the display device 1b including the display panel PA3 can achieve frame narrowing in the frame region NDA provided with the narrow portion EP of the first trunk wiring line ELVDDM4', and can also achieve frame narrowing in the frame region NDA provided with the narrow portion EP of the third trunk wiring line ELVDDM5'.

Note that, although not illustrated, similarly to the first edge portion DR1, the second edge portion DR2 of the display region DA2 may include an irregular edge different in shape from the edge of the display region DA2 formed of the second side H1'.

Figure 7:
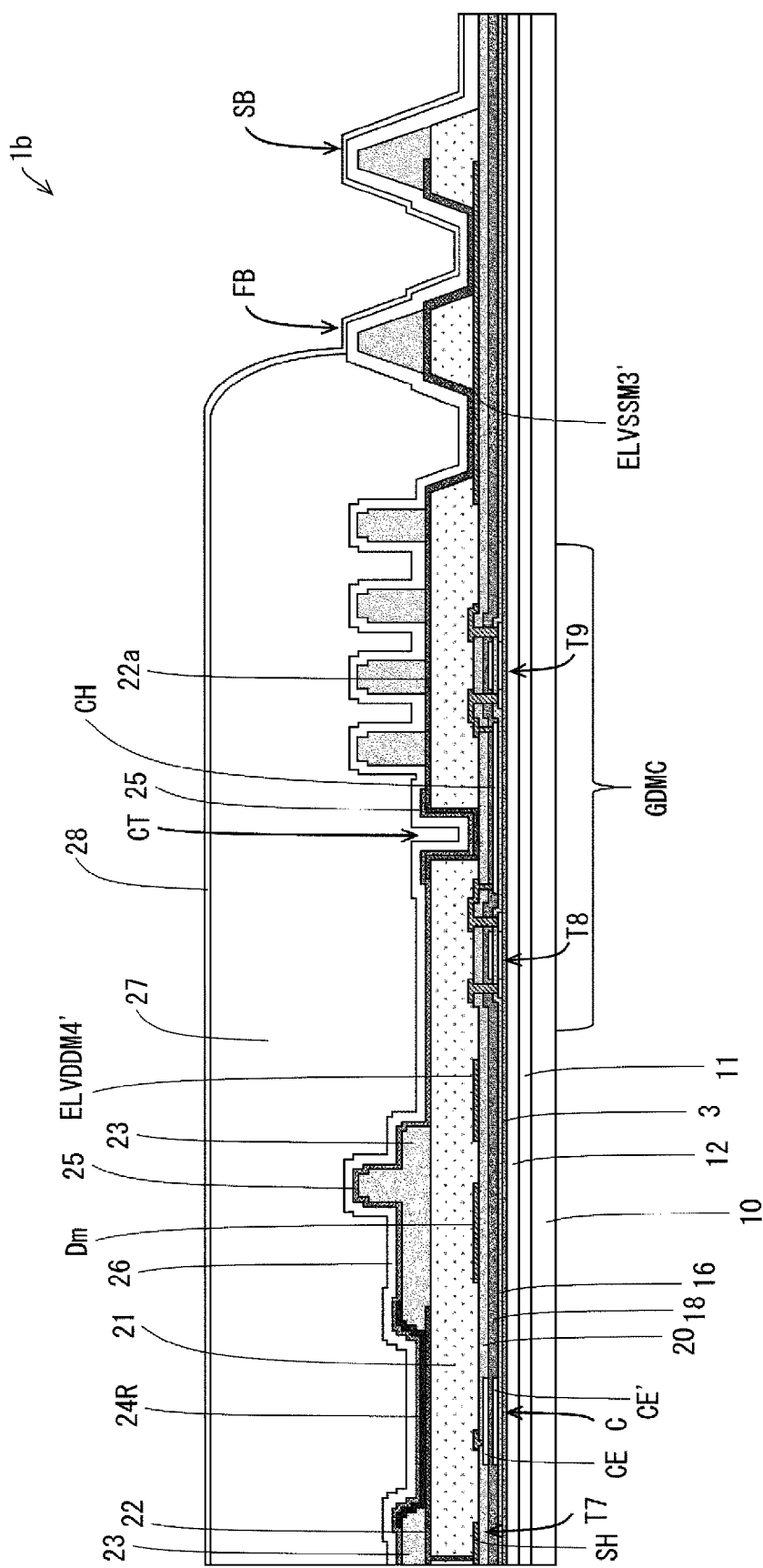
FIG. 7 is a cross-sectional view taken along a line Z-Z' of the display device according to the third embodiment illustrated in FIG. 6.

FIG. 7 is a cross-sectional view taken along a line Z-Z' of the display device 1b illustrated in FIG. 6.

In the present embodiment, as illustrated in FIG. 7, all of a data signal line Dm of the display region DA2, the first trunk wiring line ELVDDM4' of the frame region NDA, and the second trunk wiring line ELVSSM3' of the frame region NDA are formed in a layer SH forming a source electrode and a drain electrode of a second initialization transistor T7, and a wiring line of the source and drain electrodes.

Further, a second electrode 25 being a common electrode is formed to the outside of a trench CT, and is electrically connected to a conductive film 22a formed of the same material as the second electrode 25 and a first electrode 22 by using a trench CT structure. Then, the second electrode 25 being the common electrode is electrically connected to the second trunk wiring line ELVSSM3' of an ELVSS voltage line through the conductive film 22a on the inside of a second bank SB formed farther from the display region DA2 than a first bank FB.

Further, as illustrated in FIGS. 6 and 7, between the narrow portion EP of the first trunk wiring line ELVDDM4' and the portion FP formed along the narrow portion EP of the first trunk wiring line ELVDDM4' in the second trunk wiring line ELVSSM3', there is a control circuit formation region GDMC in which various transistors including a control transistor T8 and a control transistor T9 are formed to be monolithic.

Note that the control transistor T8 and the control transistor T9 are electrically connected to each other by a connection wiring line CH, and constitute a part of a scanning-side drive circuit 32 (illustrated in FIG. 2).

Note that a first irregular edge included in the edge portion (first edge portion) DR1 of the display region DA2 refers to a shape portion of the edge portion (first edge portion) DR1 formed of the third side H4 different in shape from the edge portion (first edge portion) DR1 formed of the first side H1. Further, the straight portion of the first trunk wiring line ELVDDM4' formed along the extension direction of the first side H1 refers to the thick portion CP itself of the first trunk wiring line ELVDDM4'. The second portion of the first trunk wiring line ELVDDM4' refers to a portion that is included in the thick portion CP of the first trunk wiring line ELVDDM4' being the straight portion, and has the greatest line width in the thick portion CP. Furthermore, the inclined portion of the first trunk wiring line ELVDDM4' formed along the first irregular edge refers to the narrow portion EP itself of the first trunk wiring line ELVDDM4'. A first portion of the first trunk wiring line ELVDDM4' is included in the narrow portion EP of the first trunk wiring line ELVDDM4' being the inclined portion. In other words, the first irregular edge is the inclined edge including the third side H4 that forms a predetermined angle with the first side H1.

Further, in the second trunk wiring line ELVSSM3', the fourth portion of the second trunk wiring line ELVSSM3' is the straight portion LP that is connected to the third portion being the portion FP formed along the narrow portion EP of the first trunk wiring line ELVDDM4', and extends in the same direction as the extension direction of the first side H1.

Meanwhile, a fifth portion of the third trunk wiring line ELVDDM5' refers to a part of the narrow portion EP of the third trunk wiring line ELVDDM5' illustrated in FIG. 6. The fifth portion of the third trunk wiring line ELVDDM5' is included in the narrow portion EP of the third trunk wiring line ELVDDM5'.

Further, a sixth portion of the third trunk wiring line ELVDDM5' refers to a part of the thick portion CP of the third trunk wiring line ELVDDM5' illustrated in FIG. 6. The sixth portion of the third trunk wiring line ELVDDM5' is included in the thick portion CP of the third trunk wiring line ELVDDM5'. Then, when the line width of the thick portion CP is not fixed, the sixth portion refers to a portion of the thick portion CP having the greatest line width.

Fourth Embodiment

Next, with reference to FIG. 8, a fourth embodiment of the disclosure will be described. A display device 1c according to the present embodiment is different from the third embodiment in that both ends of a first edge portion DR1 of a display region DA3 are formed of a fourth side H5 different from the first side H1 of the display region DA3 facing a terminal portion TER, a point that a thick portion CP of a first trunk wiring line ELVDDM6' is a straight portion having the same line width in an extension direction of branch wiring lines ELVDDE1 to ELVDDEn, and a point that a narrow portion EP of the first trunk wiring line ELVDDM6' is a curved portion, and other points are as described above in the third embodiment. For convenience of description, members having the same functions as those of the members illustrated in the drawings in the third embodiment are denoted by the same reference numerals, and descriptions thereof will be omitted.

Figure 8:
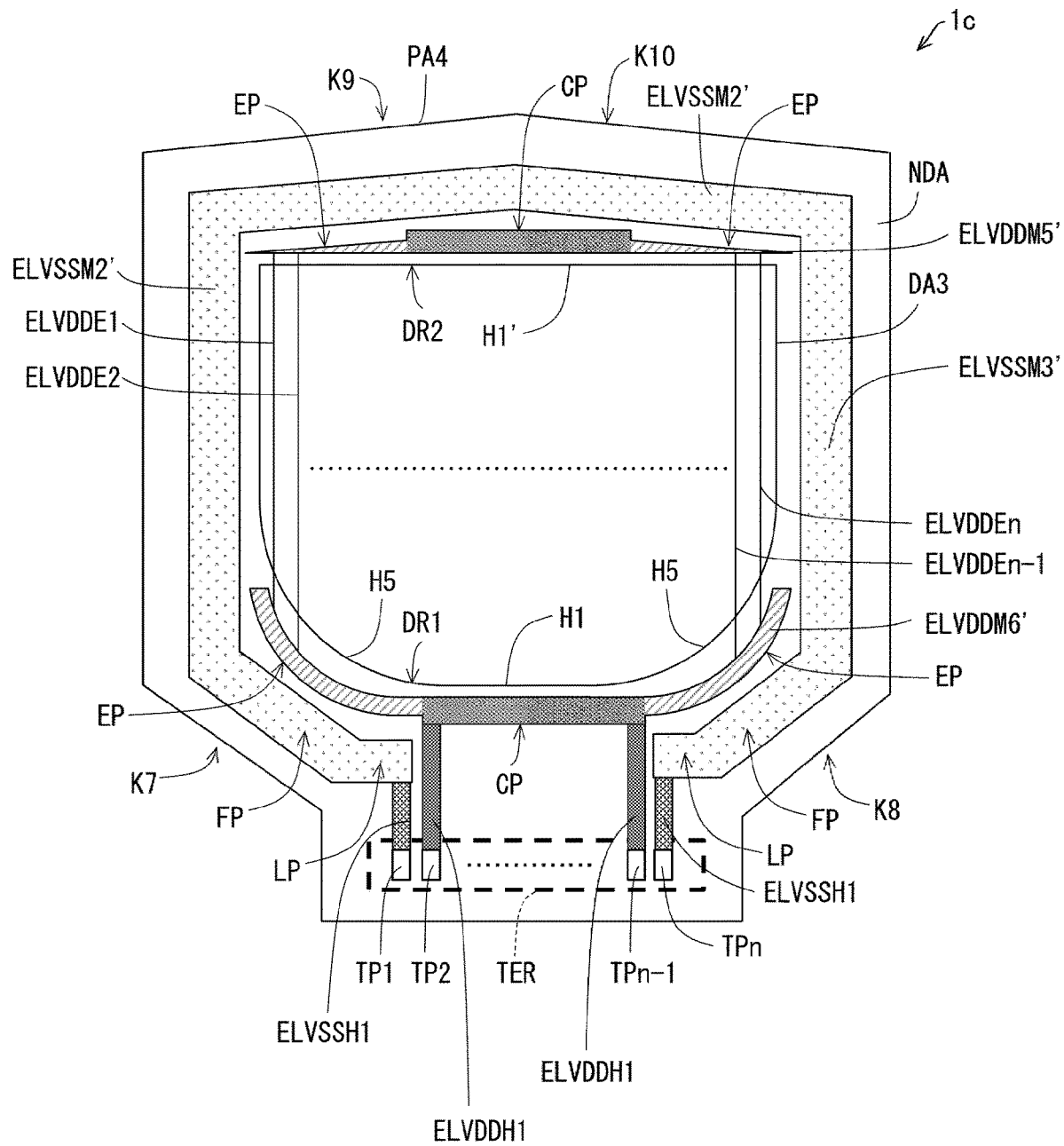
FIG. 8 is a schematic plan view illustrating a general configuration of a display device according to a fourth embodiment.

FIG. 8 is a schematic plan view illustrating a general configuration of the display device 1c including a display panel PA4 according to the fourth embodiment.

As illustrated in FIG. 8, an ELVDD voltage line (first power supply voltage line) includes the first trunk wiring line ELVDDM6', the branch wiring lines ELVDDE1 to ELVDDEn, and a third trunk wiring line ELVDDM5'.

The first trunk wiring line ELVDDM6' is provided in a frame region NDA along the first edge portion DR1 of the display region DA3 formed of the first side H1 facing the terminal portion TER and the two fourth sides H5 formed so as to sandwich the first side H1. In the display panel PA4, both ends of the first edge portion DR1 of the display region DA3 are formed of the fourth sides H5, and form a curved edge being an irregular edge. Each of the branch wiring lines ELVDDE1 to ELVDDEn is electrically connected to the first trunk wiring line ELVDDM6' and the third trunk wiring line ELVDDM5', extends from the third trunk wiring line ELVDDM5' to the first trunk wiring line ELVDDM6' in a direction intersecting the first edge portion DR1 and a second edge portion DR2, and is provided in the frame region NDA and the display region DA3.

As illustrated in FIG. 8, the first trunk wiring line ELVDDM6' includes a narrow portion EP connected to some of the branch wiring lines (for example, ELVDDE1, ELVDDE2, ELVDDEn-1, ELVDDEn, and the like) intersecting an end portion of the first edge portion DR1 among the plurality of branch wiring lines ELVDDE1 to ELVDDEn, and includes a thick portion CP connected to some other of the branch wiring lines intersecting a central portion of the first edge portion DR1 among the plurality of branch wiring lines ELVDDE1 to ELVDDEn. Note that a line width of the narrow portion EP of the first trunk wiring line ELVDDM6', i.e., the shortest distance between an edge of the narrow portion EP on a closer side from the fourth side H5 of the first edge portion DR1 of the display region DA3 and an edge of the narrow portion EP on a farther side from the fourth side H5 of the first edge portion DR1 of the display region DA3 is smaller than a line width of the thick portion CP of the first trunk wiring line ELVDDM6' in the extension direction of the branch wiring lines ELVDDE1 to ELVDDEn.

In the display panel PA4 illustrated in FIG. 8, a current flows through the entire surface of the display region DA3, and thus a central portion of the first trunk wiring line ELVDDM6' that is electrically connected to two lead wiring lines ELVDDH1 and needs a relatively thick line width is the thick portion CP of the first trunk wiring line ELVDDM6'. Meanwhile, the number of subpixels and the branch wiring lines that are a target through which a current flows decreases with decreasing distance from the end portion of the first edge portion DR1 of the display region DA3. Thus, a current flowing through the first trunk wiring line ELVDDM6' corresponding to the end portion of the first edge portion DR1 of the display region DA3 decreases. Therefore, the line width of the narrow portion EP of the first trunk wiring line ELVDDM6' can be made smaller than the line width of the thick portion CP of the first trunk wiring line ELVDDM6'.

As illustrated in FIG. 8, a length in the display region DA3 of some of the branch wiring lines (for example, ELVDDE1, ELVDDE2, ELVDDEn-1, ELVDDEn, and the like) intersecting the fourth side H5 of the first edge portion DR1 of the display region DA3 among the branch wiring lines ELVDDE1 to ELVDDEn is shorter than a length in the display region DA3 of some other of the branch wiring lines intersecting the first side H1 of the first edge portion DR1 of the display region DA3 among the branch wiring lines ELVDDE1 to ELVDDEn.

The thick portion CP of the first trunk wiring line ELVDDM6' is the straight portion formed along the first side H1, and the narrow portion EP of the first trunk wiring line ELVDDM6' is the curved portion formed along the fourth side H5.

In the present embodiment, the line width of the narrow portion EP of the first trunk wiring line ELVDDM6' is fixed, but the present embodiment is not limited thereto. For example, the line width of the narrow portion EP of the first trunk wiring line ELVDDM6' may be set smaller with increasing distance from a boundary between the narrow portion EP of the first trunk wiring line ELVDDM6' and the thick portion CP of the first trunk wiring line ELVDDM6' as long as the line width of the narrow portion EP of the first trunk wiring line ELVDDM6' is smaller than the line width of the thick portion CP of the first trunk wiring line ELVDDM6'.

Further, in the present embodiment, the line width of the thick portion CP of the first trunk wiring line ELVDDM6' is fixed, but the present embodiment is not limited thereto. For example, a line width of the thick portion CP of the first trunk wiring line ELVDDM6' at the boundary with the narrow portion EP of the first trunk wiring line ELVDDM6' may be set smaller than a line width of a portion of the thick portion CP of the first trunk wiring line ELVDDM6' facing a central portion of the first side H1, and the line width of the thick portion CP of the first trunk wiring line ELVDDM6' may be set smaller with decreasing distance from the narrow portion EP of the first trunk wiring line ELVDDM6', as long as the line width of the narrow portion EP of the first trunk wiring line ELVDDM6' is smaller than the line width of the thick portion CP of the first trunk wiring line ELVDDM6'.

Unlike a known manner, the first trunk wiring line ELVDDM6' does not have a rectangular shape (see (a) of FIG. 12 and (b) of FIG. 12) in which a line width of the central portion and the portion having a concentrated current and being connected to the lead wiring line ELVDDH1, which need a relatively thick line width, remains as it is even in the end portion. As illustrated in FIG. 8, the first trunk wiring line ELVDDM6' has a shape with, as the thick portion CP, only the central portion and the portion having a concentrated current and being connected to the lead wiring line ELVDDH1, which need a relatively thick line width, and with the narrow portion EP on both ends of the thick portion CP. Note that, because a current concentrates in the portion connected to the lead wiring line ELVDDH1, for example, similarly to the thick portion CP of the first trunk wiring line ELVDDM4' included in the display device 1b illustrated in FIG. 6 according to the third embodiment described above, and the thick portion CP of the first trunk wiring line ELVDDM6' included in the display device 1d illustrated in FIG. 9 according to the fifth embodiment described below, it is preferable that a width of the thick portion CP of the first trunk wiring lines ELVDDM4' and ELVDDM6' in the extension direction of the first side H1 is greater than a width acquired by combining a width of the two lead wiring lines ELVDDH1 in the extension direction of the first side H1 and a width between the two lead wiring lines ELVDDH1 in the extension direction of the first side H1.

A voltage of the ELVDD voltage line (first power supply voltage line) is preferably supplied to the thick portion CP of the first trunk wiring line ELVDDM6' through the lead wiring line ELVDDH1 of the ELVDD voltage line (first power supply voltage line) extending from the terminal portion TER.

In the frame region NDA provided with the narrow portion EP of the first trunk wiring line ELVDDM6', the line width of the narrow portion EP is smaller than the line width of the thick portion CP, and thus a distance from an edge of the first trunk wiring line ELVDDM6' on the display region DA3 side to edges K7 and K8 of the frame region NDA can be reduced.

As described above, the display device 1c including the display panel PA4 can achieve frame narrowing in the frame region NDA provided with the narrow portion EP of the first trunk wiring line ELVDDM6', and can also achieve frame narrowing in the frame region NDA provided with the narrow portion EP of the third trunk wiring line ELVDDM5'.

Fifth Embodiment

Next, with reference to FIGS. 9 and 10, the fifth embodiment of the disclosure will be described. The display device 1d according to the present embodiment is different from the fourth embodiment in that a notch portion NT is included in a second edge portion DR2 of a display region DA4, and a point that a second trunk wiring line ELVSSM4' does not include the straight portion LP (fourth portion) extending in the same direction as the extension direction of the first side H1 as illustrated in FIG. 8, and other points are as described above in the fourth embodiment. For convenience of description, members having the same functions as those of the members illustrated in the drawings in the fourth embodiment are denoted by the same reference numerals, and descriptions thereof will be omitted.

Figure 9:
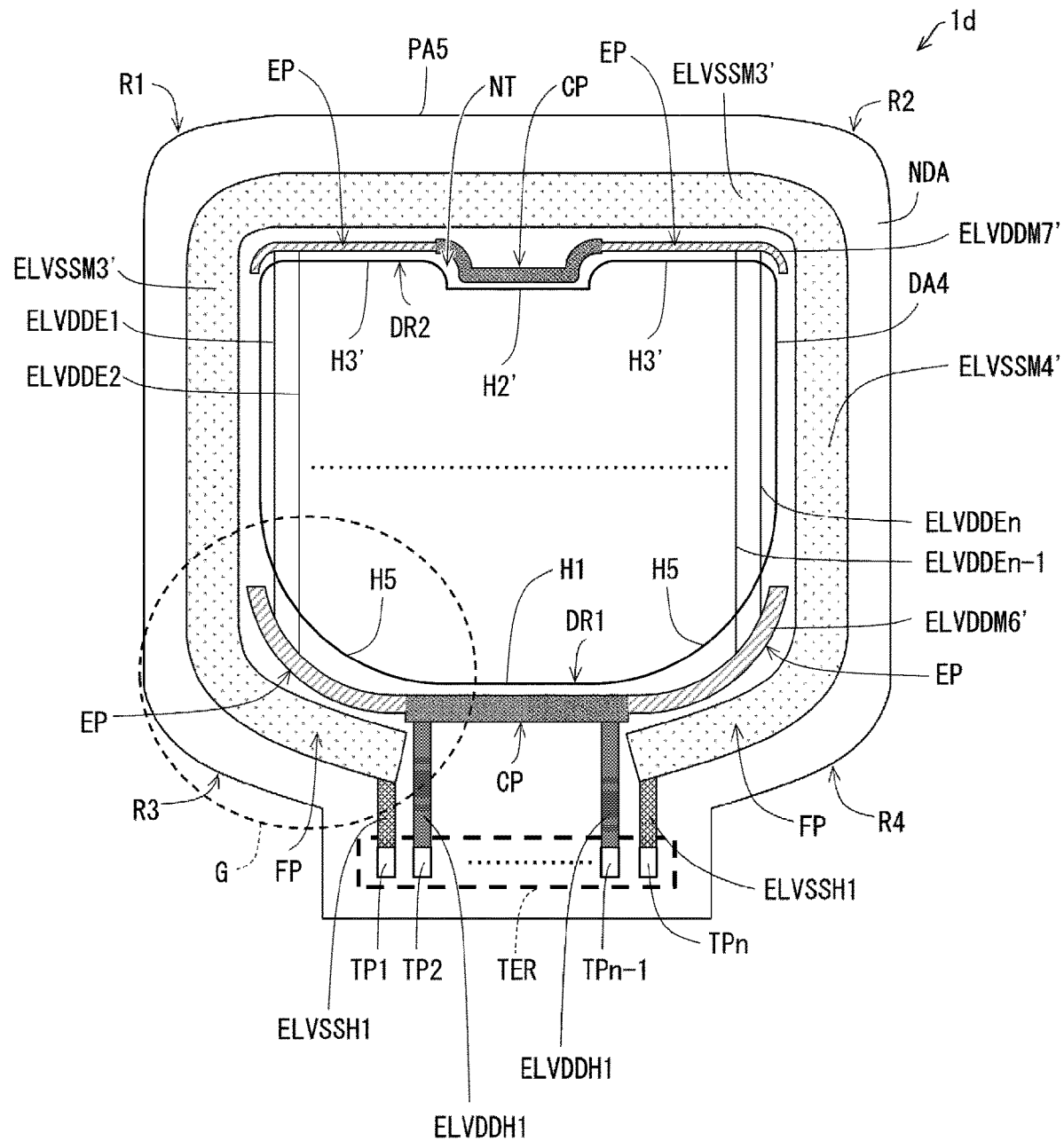
FIG. 9 is a schematic plan view illustrating a general configuration of a display device according to a fifth embodiment.

FIG. 9 is a schematic plan view illustrating a general configuration of the display device 1d including a display panel PA5 according to the fifth embodiment.

As illustrated in FIG. 9, an ELVDD voltage line (first power supply voltage line) includes the first trunk wiring line ELVDDM6', branch wiring lines ELVDDE1 to ELVDDEn, and a third trunk wiring line ELVDDM7'.

The third trunk wiring line ELVDDM7' is provided in a frame region NDA along the second edge portion DR2 of the display region DA4 including a fifth side H2' formed of only a straight line facing the first side H1. Each of the branch wiring lines ELVDDE1 to ELVDDEn is electrically connected to the first trunk wiring line ELVDDM6' and the third trunk wiring line ELVDDM7', extends from the third trunk wiring line ELVDDM7' to the first trunk wiring line ELVDDM6' in a direction intersecting a first edge portion DR1 and the second edge portion DR2, and is provided in the frame region NDA and the display region DA4.

As illustrated in FIG. 9, the notch portion NT is formed in the second edge portion DR2 in the display region DA4, and one side of the notch portion NT is the fifth side H2' of the second edge portion DR2 of the display region DA4. The third trunk wiring line ELVDDM7' includes a thick portion CP connected to some of the branch wiring lines intersecting a central portion of the second edge portion DR2 including the fifth side H2' among the branch wiring lines ELVDDE1 to ELVDDEn, and includes a narrow portion EP connected to some other of the branch wiring lines (for example, ELVDDE1, ELVDDE2, ELVDDEn-1, ELVDDEn, and the like) intersecting an end portion of the second edge portion DR2 among the plurality of branch wiring lines ELVDDE1 to ELVDDEn. A line width of the thick portion CP of the third trunk wiring line ELVDDM7', i.e., the shortest distance between an edge of the thick portion CP on a closer side from the second edge portion DR2 of the display region DA4 and an edge of the thick portion CP on a farther side from the second edge portion DR2 of the display region DA4 is greater than a line width of the narrow portion EP of the third trunk wiring line ELVDDM7', i.e., the shortest distance between an edge of the narrow portion EP on a closer side from the second edge portion DR2 of the display region DA4 and an edge of the narrow portion EP on a farther side from the second edge portion DR2 of the display region DA4.

According to the configuration described above, the line width of the thick portion CP of the third trunk wiring line ELVDDM7' is greater than the line width of the narrow portion EP of the third trunk wiring line ELVDDM7', and thus an IR drop near the display region DA4 in which the notch portion NT is formed can be suppressed.

As illustrated in FIG. 9, an edge of the frame region NDA provided with the narrow portion EP of the third trunk wiring line ELVDDM7' includes second irregular frame edges R1 and R2. Note that the second irregular frame edges R1 and R2 are edges in which a width of at least a part of the frame region NDA provided with the narrow portion EP of the third trunk wiring line ELVDDM7' is formed to be smaller than a width of the frame region NDA provided with the thick portion CP of the third trunk wiring line ELVDDM7'.

In the present embodiment, a case where the line width of the thick portion CP of the third trunk wiring line ELVDDM7' is fixed is described as an example, but the present embodiment is not limited thereto. For example, the line width of the thick portion CP of the third trunk wiring line ELVDDM7' may be set greater with increasing distance from the narrow portion EP of the third trunk wiring line ELVDDM7' as long as the line width of the thick portion CP of the third trunk wiring line ELVDDM7' is greater than the line width of the narrow portion EP of the third trunk wiring line ELVDDM7'.

Further, in the present embodiment, as illustrated in FIG. 9, a case where the second edge portion DR2 of the display region DA4 includes the fifth side H2' formed of only one straight line and two sixth sides H3' in which both ends are curved lines is described as an example, but the present embodiment is not limited thereto. The second edge portion DR2 of the display region DA4 may include one fifth side H2' and one sixth side H3'.

Further, in the present embodiment, as illustrated in FIG. 9, a case where the second edge portion DR2 of the display region DA4 includes a curved edge is described above as an example, but the present embodiment is not limited thereto. For example, the second edge portion DR2 of the display region DA4 may include an inclined edge.

Further, in the present embodiment, as illustrated in FIG. 9, in the second trunk wiring line ELVSSM4', a portion FP (third portion) formed along the narrow portion EP of the first trunk wiring line ELVDDM6' is a curved portion (a portion curved with respect to the extension direction of the first side H1).

Unlike a known manner, the first trunk wiring line ELVDDM6' does not have a rectangular shape (see (a) of FIG. 12 and (b) of FIG. 12) in which a line width of the central portion and the portion having a concentrated current and being connected to the lead wiring line ELVDDH1, which need a relatively thick line width, remains as it is even in the end portion. As illustrated in FIG. 9, the first trunk wiring line ELVDDM6' has a shape with, as the thick portion CP, only the central portion and the peripheral portion having a concentrated current and being connected to the lead wiring line ELVDDH1, which need a relatively thick line width, and with the narrow portion EP on both ends of the thick portion CP. In the present embodiment, as illustrated in FIG. 9, from a point that the current is concentrated in a portion to which the lead wiring line ELVDDH1 is connected, the peripheral portion in which the current is concentrated and to which the lead wiring line ELVDDH1 is connected is also the thick portion CP. Therefore, a width, in the extension direction of the first side H1, of the thick portion CP of the first trunk wiring line ELVDDM6' included in the display device 1d illustrated in FIG. 9 is greater than a width acquired by combining a width of two lead wiring lines ELVDDH1 in the extension direction of the first side H1 and a width between the two lead wiring lines ELVDDH1 in the extension direction of the first side H1.

A voltage of the ELVDD voltage line (first power supply voltage line) is preferably supplied to the thick portion CP of the first trunk wiring line ELVDDM6' through the lead wiring line ELVDDH1 of the ELVDD voltage line (first power supply voltage line) extending from the terminal portion TER.

In the frame region NDA provided with the narrow portion EP of the first trunk wiring line ELVDDM6', the line width of the narrow portion EP is smaller than the line width of the thick portion CP, and thus a distance from an edge of the first trunk wiring line ELVDDM6' on the display region DA4 side to edges R3 and R4 of the frame region NDA can be reduced.

As described above, the display device 1d including the display panel PA5 can achieve frame narrowing in the frame region NDA provided with the narrow portion EP of the first trunk wiring line ELVDDM6', and can also achieve frame narrowing in the frame region NDA provided with the narrow portion EP of the third trunk wiring line ELVDDM7'.

Further, although not illustrated in FIG. 9, the ELVDD voltage line (first power supply voltage line) may further include, near the second edge portion DR2 of the display region DA4, a second branch wiring line formed in parallel with the first side H1 and the fifth side H2' and electrically connected to the thick portion CP of the third trunk wiring line ELVDDM7', together with the first trunk wiring line ELVDDM6', the branch wiring lines ELVDDE1 to ELVDDEn, and the third trunk wiring line ELVDDM7'. Note that the second branch wiring line formed in parallel with the first side H1 and the fifth side H2' may be formed of the same material as the branch wiring lines ELVDDE1 to ELVDDEn so as to be in the same layer as the branch wiring lines ELVDDE1 to ELVDDEn, for example. Improvement in the brightness distribution of the display device 1d can be expected by providing such a second branch wiring line.

Figure 10:
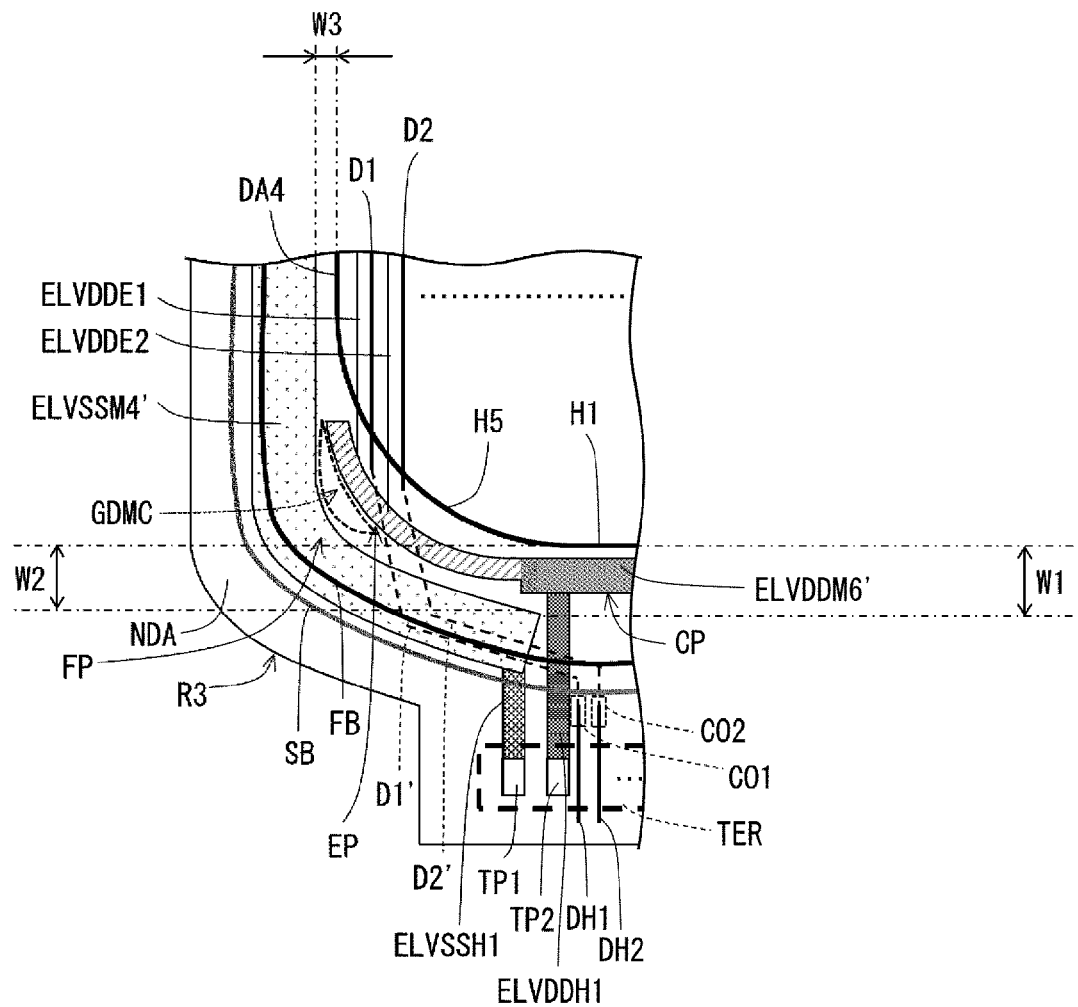
FIG. 10 is a partial enlarged view of a portion G of the display device according to the fifth embodiment illustrated in FIG. 9.

FIG. 10 is a partial enlarged view of a portion G of the display device 1d illustrated in FIG. 9.

As illustrated in FIG. 10, in the display device 1d, the first trunk wiring line ELVDDM6' and the second trunk wiring line ELVSSM4' are provided in this order from the display region DA4 side in a region of the frame region NDA provided with the first trunk wiring line ELVDDM6' and the second trunk wiring line ELVSSM4'.

In the present embodiment, the scanning-side drive circuit 32 (illustrated in FIG. 2) including various transistors is formed to be monolithic between the narrow portion EP of the first trunk wiring line ELVDDM6' and the portion FP (third portion) of the second trunk wiring line ELVSSM4' formed along the narrow portion EP, i.e., in a control circuit formation region GDMC in FIG. 10.

As illustrated in FIG. 10, data signal lines D1, D2, . . . formed of the same material in the same step as the layer SH (illustrated in FIG. 4) (hereinafter referred to as the SH layer), which forms a source electrode, a drain electrode, and a wiring line of the source and drain electrodes, so as to be in the same layer as the SH layer are provided in the display region DA4 and the frame region NDA. Data signal lines D1', D2', . . . indicated by a dotted line in FIG. 10 and formed of the same material in the same step as a layer (illustrated in FIG. 4) (hereinafter referred to as the GE layer), which forms a gate electrode GE, so as to be in the same layer as the GE layer are provided in the frame region NDA.

As illustrated in FIG. 10, each of the data signal lines D1', D2', . . . indicated by the dotted line and electrically connected to each of the data signal lines D1, D2, . . . overlaps, in the frame region NDA, the narrow portion EP of the first trunk wiring line ELVDDM6' and the portion FP of the second trunk wiring line ELVSSM4' that are formed in the SH layer. Thus, each of the data signal lines D1', D2', . . . is formed in the GE layer different from the SH layer being a layer for forming the first trunk wiring line ELVDDM6' and the second trunk wiring line ELVSSM4'.

In other words, while the data signal lines D1', D2', . . . indicated by the dotted line overlap, in the frame region NDA, the narrow portion EP of the first trunk wiring line ELVDDM6' and the portion FP of the second trunk wiring line ELVSSM4' that are formed in the SH layer, the data signal lines D1', D2', . . . indicated by the dotted line are formed in the GE layer different from the SH layer to achieve a wiring line that ensures electrical insulation. Note that, in the present embodiment, a case where the data signal lines D1', D2', . . . indicated by the dotted line are formed by using the GE layer (see FIG. 4) being a lower layer below the SH layer is described as an example. However, the present embodiment is not limited thereto as long as the data signal lines D1', D2', . . . are formed in a layer different from the SH layer.

Each of the data signal lines D1', D2', . . . indicated by the dotted line is electrically connected, through each of contact holes CO1, CO2, . . . provided in the frame region NDA, to each of lead wiring lines DH1, DH2, . . . of the data signal line provided in the frame region NDA. Note that, in the present embodiment, a case where each of the lead wiring lines DH1, DH2, . . . of the data signal line is formed by using the SH layer being an upper layer above the GE layer (see FIG. 4) forming the data signal lines D1', D2', . . . indicated by the dotted line is described as an example. However, the present embodiment is not limited thereto as long as each of the lead wiring lines DH1, DH2, . . . is formed in a layer different from the GE layer.

As illustrated in FIG. 10, in the display device 1d, a first distance W1 is greater than a second distance W2, and the second distance W2 is greater than a third distance W3.

The first distance W1 is a distance in a direction orthogonal to the first side H1 between the first side H1 formed of a straight line and a portion of the second trunk wiring line ELVSSM4' closest to a central portion of the first side H1. In other words, the first distance W1 is a length of a line drawn from an upper right vertex of the portion FP (third portion) of the second trunk wiring line ELVSSM4' to the first side H1 in the direction orthogonal to the first side H1.

The second distance W2 is a distance in the direction orthogonal to the first side H1 between a boundary between the first side H1 formed of the straight line and a fourth side H5 formed of a curved line, and the second trunk wiring line ELVSSM4'. In other words, the second distance W2 is a length of a line drawn from a boundary point between the first side H1 and the fourth side H5 to an edge of the portion FP (third portion) of the second trunk wiring line ELVSSM4' on the display region DA4 side in the direction orthogonal to the first side H1.

The third distance W3 is the shortest distance between an edge of an edge of the display region DA4 in the direction orthogonal to the first side H1, and the second trunk wiring line ELVSSM4'.

Further, as illustrated in FIG. 10, a first bank FB surrounds the entire display region DA4 in a frame-like shape, and is provided in a position overlapping the second trunk wiring line ELVSSM4'. A second bank SB surrounds the entire first bank FB in a frame-like shape, and is provided between the second trunk wiring line ELVSSM4' and an edge of the frame region NDA.

Note that, in the present embodiment, a case where the first bank FB and the second bank SB are formed in a shape along a shape of the second trunk wiring line ELVSSM4' is described as an example. However, the shape of the first bank FB and the second bank SB is not particularly limited as long as the entire display region DA4 can be surrounded in a frame-like shape.

Further, in the present embodiment, a case where both the first bank FB and the second bank SB are provided is described as an example, but only one of the first bank FB and the second bank SB may be provided.

Sixth Embodiment

Next, with reference to FIG. 11, the sixth embodiment of the disclosure will be described. In the display device 1e according to the present embodiment, a shape of the first trunk wiring line ELVDDM8' and a shape of a second trunk wiring line ELVSSM5' are different from the shape of the first trunk wiring line and the shape of the second trunk wiring line according to the first to fifth embodiments described above.

Figure 11:
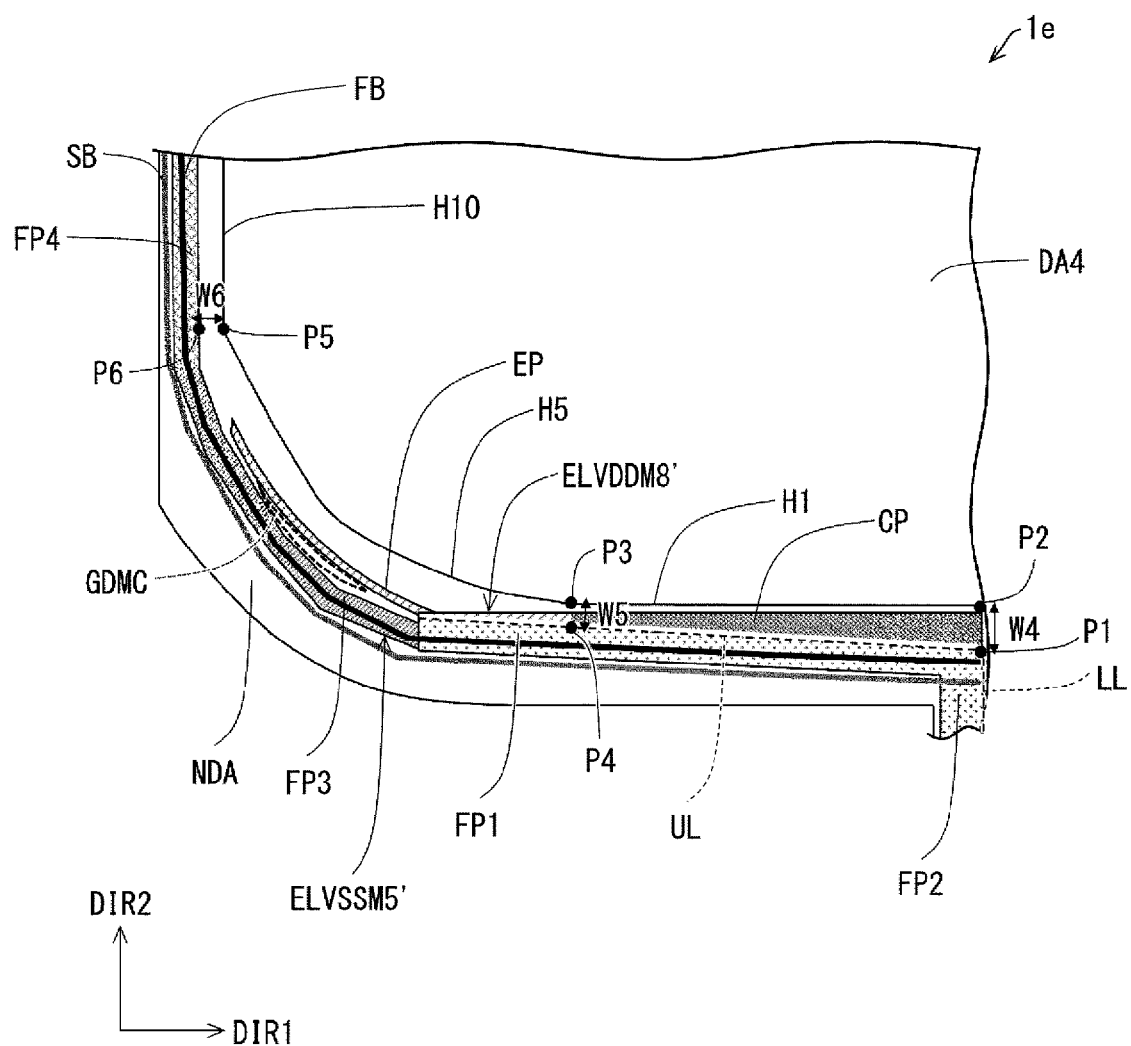
FIG. 11 is a partial enlarged view of a part of a display device according to a sixth embodiment.

FIG. 11 is a partial enlarged view of a part of the display device 1e according to the sixth embodiment.

Note that FIG. 11 does not illustrate a terminal portion, a data signal line, a contact hole, a lead wiring line of the data signal line, a branch wiring line electrically connected to the first trunk wiring line ELVDDM8', and the like, but these can be provided similarly to the case of the display device 1d illustrated in FIG. 10 described above.

As illustrated in FIG. 11, the first trunk wiring line ELVDDM8' includes the narrow portion EP and the thick portion CP. The narrow portion EP of the first trunk wiring line ELVDDM8' is connected to some of the branch wiring lines formed near left and right edges of a display region DA4 in FIG. 11 among the plurality of branch wiring lines (not illustrated). Meanwhile, the thick portion CP of the first trunk wiring line ELVDDM8' is connected to some other of the branch wiring lines formed in a central portion of the display region DA4 sandwiched between the above-described left and right edges of the display region DA4 in FIG. 11 among the plurality of branch wiring lines (not illustrated).

As illustrated in FIG. 11, the thick portion CP of the first trunk wiring line ELVDDM8' is formed in a shape in which a line width in a second direction DIR2 in FIG. 11 decreases with decreasing distance from the narrow portion EP of the first trunk wiring line ELVDDM8'. In other words, the thick portion CP of the first trunk wiring line ELVDDM8' is a straight portion of the first trunk wiring line ELVDDM8' formed along a first side H1. Then, the narrow portion EP of the first trunk wiring line ELVDDM8' is formed of a second straight portion of the first trunk wiring line ELVDDM8' extending from the straight portion of the first trunk wiring line ELVDDM8', and a curved portion of the first trunk wiring line ELVDDM8' formed along a first irregular edge including a fourth side H5.

A line width of the second straight portion of the first trunk wiring line ELVDDM8' in the second direction DIR2 in FIG. 11 is smaller than the line width of the straight portion of the first trunk wiring line ELVDDM8' in the second direction DIR2 in the FIG. 11.

Further, the line width of the second straight portion of the first trunk wiring line ELVDDM8' in the second direction DIR2 in FIG. 11 and the line width of the straight portion of the first trunk wiring line ELVDDM8' in the second direction DIR2 in FIG. 11 decrease with decreasing distance from the curved portion of the first trunk wiring line ELVDDM8'.

Further, as illustrated in FIG. 11, the second trunk wiring line ELVSSM5' includes a portion FP1 formed along the thick portion CP and the second straight portion of the first trunk wiring line ELVDDM8', a lead-out portion FP2, a portion FP3 formed along the narrow portion EP of the first trunk wiring line ELVDDM8', and a portion FP4 formed along a seventh side H10 of the display region DA4.

Note that, in FIG. 11, a distance W4 between a point P1 and a point P2 is greater than a distance W5 between a point P3 and a point P4 and a distance W6 between a point P5 and a point P6, and the distance W5 between the point P3 and the point P4 is greater than the distance W6 between the point P5 and the point P6.

The distance W4 is a distance in the second direction DIR2 perpendicular to a first direction DIR1 being an extension direction of the first side H1 between a position (point P1) of the second trunk wiring line ELVSSM5' located on the closest side to the center of the first side H1 formed of the straight line, and the display region DA4. In other words, the distance W4 is a length of a line from the point P1 to the point P2 located on the first side H1 of the display region DA4 when the line is drawn in the second direction DIR2 from the point P1, which is an intersection point between a right side LL of the lead-out portion FP2 of the second trunk wiring line ELVSSM5' and an upper side UL of the portion FP1 of the second trunk wiring line ELVSSM5', to the first side H1 of the display region DA4.

The distance W5 is a length of a line from the point P3 to the point P4 located on the upper side UL of the portion FP1 of the second trunk wiring line ELVSSM5' when the line is drawn in the second direction DIR2 from the boundary point P3 between the first side H1 formed of the straight line of the display region DA4 and the fourth side H5 formed of a curved line to the second trunk wiring line ELVSSM5'.

The distance W6 is a length of a line from the point P5 to the point P6 located on the second trunk wiring line ELVSSM5' when the line is drawn in the first direction DIR1 being the extension direction of the first side H1 from the boundary point P5 between the seventh side H10 formed of the straight line of the display region DA4 and the fourth side H5 formed of the curved line to the second trunk wiring line ELVSSM5'.

Unlike a known manner, the first trunk wiring line ELVDDM8' does not have a rectangular shape (see (a) of FIG. 12 and (b) of FIG. 12) in which a line width of the central portion and the portion having a concentrated current and being connected to the lead wiring line ELVDDH1, which need a relatively thick line width, remains as it is even in the end portion. As illustrated in FIG. 11, a line width in the second direction DIR2 of the central portion and the peripheral portion having a concentrated current and being connected to the lead wiring line, which need a relatively thick line width, is greater than a line width in the second direction DIR2 of an end portion of the thick portion CP of the first trunk wiring line ELVDDM8'. Further, the first trunk wiring line ELVDDM8' has a shape including the narrow portion EP on both ends of the thick portion CP. Therefore, in a frame region NDA provided with the narrow portion EP and the edge of the thick portion CP of the first trunk wiring line ELVDDM8', the line width of the narrow portion EP and the edge of the thick portion CP of the first trunk wiring line ELVDDM8' is smaller than the line width of the central portion of the thick portion CP of the first trunk wiring line ELVDDM8' and the peripheral portion having a concentrated current and being connected to the lead wiring line. Thus, a distance from the edge of the first trunk wiring line ELVDDM8' on the display region DA4 side to the edge of the frame region NDA can be reduced.

As described above, the display device 1e can achieve frame narrowing in the frame region NDA.

Further, as illustrated in FIG. 11, a first bank FB surrounds the entire display region DA4 in a frame-like shape, and is provided in a position overlapping the second trunk wiring line ELVSSM5'. A second bank SB surrounds the entire first bank FB in a frame-like shape, and is provided between the second trunk wiring line ELVSSM5' and the edge of the frame region NDA.

Note that, in the present embodiment, a case where the first bank FB and the second bank SB are formed in a shape along a shape of the second trunk wiring line ELVSSM5' is described as an example. However, the shape of the first bank FB and the second bank SB is not particularly limited as long as the entire display region DA4 can be surrounded in a frame-like shape.

Further, in the present embodiment, a case where both the first bank FB and the second bank SB are provided is described as an example, but only one of the first bank FB and the second bank SB may be provided.

Supplement

First Aspect

A display device including:
a display region;
a frame region surrounding the display region;
a plurality of light-emitting elements provided in the display region; and
a terminal portion provided on one edge of the frame region,
wherein the display device further includes a first power supply voltage line and a second power supply voltage line,
the first power supply voltage line includes a first trunk wiring line, and a plurality of branch wiring lines,
the first trunk wiring line is provided in the frame region along a first edge portion of the display region including a first side facing the terminal portion,
the plurality of branch wiring lines are electrically connected to the first trunk wiring line, extend from the first trunk wiring line in a direction intersecting the first edge portion, and are provided in the frame region and the display region,
the first trunk wiring line includes a first portion connected to some of the plurality of branch wiring lines intersecting an end portion of the first edge portion among the plurality of branch wiring lines, and includes a second portion connected to some other of the branch wiring lines intersecting a central portion of the first edge portion among the plurality of branch wiring lines,
the second power supply voltage line includes a second trunk wiring line provided in the frame region,
each of the plurality of light-emitting elements includes a first electrode, a second electrode, and a light-emitting layer formed between the first electrode and the second electrode,
the second trunk wiring line is electrically connected to the second electrode,
a line width of the first portion is smaller than a line width of the second portion, and
an edge of the frame region provided with the first portion includes a first irregular frame edge having an irregular shape.

Second Aspect

The display device according to aspect 1,
wherein the first irregular frame edge is an edge in which a width of at least a part of the frame region provided with the first portion is formed to be smaller than a width of the frame region provided with the second portion.

Third Aspect

The display device according to aspect 1 or 2,
wherein at least one edge of both ends of the first edge portion is a first irregular edge different in shape from the first edge portion formed of the first side.

Fourth Aspect

The display device according to aspect 3,
wherein the first irregular edge is a curved edge.

Fifth Aspect

The display device according to aspect 3,
wherein the first irregular edge is an inclined edge including a side that forms a predetermined angle with the first side.

Sixth Aspect

The display device according to any one of aspects 3 to 5,
wherein a length in the display region of some of the branch wiring lines intersecting the first irregular edge among the plurality of branch wiring lines is shorter than a length in the display region of some other of the branch wiring lines intersecting the first side among the plurality of branch wiring lines.

Seventh Aspect

The display device according to aspect 4,
wherein the second portion is included in a straight portion of the first trunk wiring line formed along the first side, and
the first portion is included in a curved portion of the first trunk wiring line formed along the first irregular edge.

Eighth Aspect

The display device according to aspect 5,
wherein the second portion is included in a straight portion of the first trunk wiring line formed along the first side, and
the first portion is included in an inclined portion of the first trunk wiring line formed along the first irregular edge.

Ninth Aspect

The display device according to aspect 8,
wherein a line width of the inclined portion decreases with increasing distance from a boundary of the inclined portion with the straight portion.

Tenth Aspect

The display device according to aspect 7,
wherein a line width of the curved portion decreases with increasing distance from a boundary of the curved portion with the straight portion.

Eleventh Aspect

The display device according to aspect 1 or 2,
wherein the first edge portion includes only the first side,
the second portion is included in a straight portion of the first trunk wiring line formed along the first side, and
the first portion is formed along the first side.

Twelfth Aspect

The display device according to any one of aspects 7 to 11,
wherein a line width of a portion of the straight portion facing an edge of the first side is smaller than a line width of a portion of the straight portion facing a central portion of the first side.

Thirteenth Aspect

The display device according to any one of aspects 1 to 6,
wherein the second portion is included in the straight portion of the first trunk wiring line formed along the first side,
the first portion is included in a second straight portion of the first trunk wiring line extending from the straight portion of the first trunk wiring line, and the curved portion of the first trunk wiring line formed along the first irregular edge different in shape from the first edge portion formed along the first side,
a line width of the second straight portion of the first trunk wiring line is smaller than a line width of the straight portion of the first trunk wiring line, and
each of the line width of the second straight portion of the first trunk wiring line and the line width of the straight portion of the first trunk wiring line decreases with decreasing distance from the curved portion of the first trunk wiring line.

Fourteenth Aspect

The display device according to any one of aspects 1 to 13,
wherein the second trunk wiring line is provided in a frame-like shape and surrounds an edge of the display region except for at least a part of the edge of the display region facing the second portion.

Fifteenth Aspect

The display device according to aspect 14,
wherein the second trunk wiring line includes a third portion formed along the first portion.

Sixteenth Aspect

The display device according to aspect 15,
wherein the third portion is a portion inclined at a predetermined angle with respect to an extension direction of the first side, or a portion curved with respect to the extension direction of the first side.

Seventeenth Aspect

The display device according to aspect 15 or 16,
wherein the second trunk wiring line further includes a fourth portion that is connected to the third portion, extends in a same direction as the extension direction of the first side, and has a straight shape.

Eighteenth Aspect

The display device according to aspect 17,
wherein a line width of a central portion of the fourth portion is equal to a line width of the fourth portion at a boundary with the third portion.

Nineteenth Aspect

The display device according to aspect 17 or 18,
wherein a line width of the fourth portion is equal to a line width of the third portion.

Twentieth Aspect

The display device according to any one of aspects 15 to 19, further including
a scanning-side drive circuit,
wherein, in a region of the frame region where the first trunk wiring line and the second trunk wiring line are provided,
the first trunk wiring line and the second trunk wiring line are provided in this order from the display region side, and
the scanning-side drive circuit is provided between the first portion of the first trunk wiring line and the third portion of the second trunk wiring line.

Twenty-first Aspect

The display device according to any one of aspects 15 to 20, further including
a data signal line,
wherein the data signal line is provided in the display region and the frame region,
the data signal line is electrically connected, through a contact hole provided in the frame region, to a lead wiring line of the data signal line provided in the frame region, and
a part of the data signal line provided in the frame region is provided between the display region and the third portion of the second trunk wiring line.

Twenty-second Aspect

The display device according to any one of aspects 3 to 10,
wherein, in a region of the frame region where the first trunk wiring line and the second trunk wiring line are provided,
the first trunk wiring line and the second trunk wiring line are provided in this order from the display region side, and
for a first distance being a distance in a direction orthogonal to the first side between the first side of the display region and a portion of the second trunk wiring line closest to the central portion of the first side,
a second distance being a distance in a direction orthogonal to the first side between a boundary between the first side of the display region and the first irregular edge, and the second trunk wiring line, and
a third distance being a shortest distance between an edge of the display region in the direction orthogonal to the first side and the second trunk wiring line,
the first distance is greater than the second distance, and the second distance is greater than the third distance.

Twenty-third Aspect

The display device according to any one of aspects 1 to 22,
wherein a voltage of the first power supply voltage line is supplied to the second portion of the first trunk wiring line through a lead wiring line of the first power supply voltage line extending from the terminal portion.

Twenty-fourth Aspect

The display device according to any one of aspects 1 to 23,
wherein a voltage of the second power supply voltage line is supplied to the second trunk wiring line through a lead wiring line of the second power supply voltage line extending from the terminal portion.

Twenty-fifth Aspect

The display device according to any one of aspects 1 to 24,
wherein the first power supply voltage line further includes a third trunk wiring line,
the third trunk wiring line is provided in the frame region along a second edge portion of the display region including a second side facing the first side, and the plurality of branch wiring lines are electrically connected to the third trunk wiring line, extend from the third trunk wiring line in a direction intersecting the second edge portion, and are provided in the frame region and the display region.

Twenty-sixth Aspect

The display device according to aspect 25,
wherein the third trunk wiring line includes a fifth portion connected to some of the branch wiring lines intersecting an end portion of the second edge portion among the plurality of branch wiring lines, and includes a sixth portion connected to some other of the branch wiring lines intersecting a central portion of the second edge portion among the plurality of branch wiring lines,
a line width of the fifth portion is smaller than a line width of the sixth portion, and
an edge of the frame region provided with the fifth portion includes a second irregular frame edge having an irregular shape.

Twenty-seventh Aspect

The display device according to aspect 26,
wherein the second irregular frame edge is an edge in which a width of at least a part of the frame region provided with the fifth portion is formed to be smaller than a width of the frame region provided with the sixth portion.

Twenty-eighth Aspect

The display device according to aspect 26 or 27,
wherein at least one edge of both ends of the second edge portion is a second irregular edge different in shape from the second edge portion formed of the second side.

Twenty-ninth Aspect

The display device according to aspect 28,
wherein the second irregular edge includes a curved edge or an inclined edge.

Thirtieth Aspect

The display device according to any one of aspects 26 to 29,
wherein a notch portion is formed in the display region, one side of the notch portion is the second side of the display region,
the sixth portion is connected to some of the branch wiring lines intersecting the central portion of the second edge portion including the second side among the plurality of branch wiring lines, and
the fifth portion is connected to some other of the branch wiring lines intersecting the end portion of the second edge portion among the plurality of branch wiring lines.

Thirty-first Aspect

The display device according to aspect 30,
wherein a line width of the sixth portion increases with increasing distance from the fifth portion.

APPENDIX

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

INDUSTRIAL APPLICABILITY

The disclosure can be utilized for a display device.

The invention claimed is:
1. A display device comprising:
a display region;
a frame region surrounding the display region;
a plurality of light-emitting elements provided in the display region; and
a terminal portion provided on one edge of the frame region,
wherein the display device further comprises a first power supply voltage line and a second power supply voltage line,
the first power supply voltage line includes a first trunk wiring line, and a plurality of branch wiring lines,
the first trunk wiring line is provided in the frame region along a first edge portion of the display region including a first side facing the terminal portion,
the plurality of branch wiring lines are electrically connected to the first trunk wiring line, extend from the first trunk wiring line in a direction intersecting the first edge portion, and are provided in the frame region and the display region,
the first trunk wiring line includes a first portion connected to some of the plurality of branch wiring lines intersecting an end portion of the first edge portion among the plurality of branch wiring lines, and includes a second portion connected to some other of the branch wiring lines intersecting a central portion of the first edge portion among the plurality of branch wiring lines,
the second power supply voltage line includes a second trunk wiring line provided in the frame region,
each of the plurality of light-emitting elements includes a first electrode, a second electrode, and a light-emitting layer formed between the first electrode and the second electrode,
the second trunk wiring line is electrically connected to the second electrode,
a line width of the first portion is smaller than a line width of the second portion, and
an edge of the frame region provided with the first portion includes a first irregular frame edge having an irregular shape.
2. The display device according to claim 1,
wherein the first irregular frame edge is an edge in which a width of at least a part of the frame region provided with the first portion is formed to be smaller than a width of the frame region provided with the second portion.
3. The display device according to claim 1,
wherein at least one edge of both ends of the first edge portion is a first irregular edge different in shape from the first edge portion formed of the first side.
4. The display device according to claim 3,
wherein the first irregular edge is a curved edge.
5. The display device according to claim 3,
wherein the first irregular edge is an inclined edge including a side that forms a predetermined angle with the first side.
6. The display device according to claim 3,
wherein a length in the display region of some of the branch wiring lines intersecting the first irregular edge among the plurality of branch wiring lines is shorter than a length in the display region of some other of the branch wiring lines intersecting the first side among the plurality of branch wiring lines.
7. The display device according to claim 3,
wherein, in a region of the frame region where the first trunk wiring line and the second trunk wiring line are provided,
the first trunk wiring line and the second trunk wiring line are provided in this order from the display region side, and
for a first distance being a distance in a direction orthogonal to the first side between the first side of the display region and a portion of the second trunk wiring line closest to the central portion of the first side,
a second distance being a distance in a direction orthogonal to the first side between a boundary between the first side of the display region and the first irregular edge, and the second trunk wiring line, and
a third distance being a shortest distance between an edge of the display region in the direction orthogonal to the first side and the second trunk wiring line,
the first distance is greater than the second distance, and the second distance is greater than the third distance.
8. The display device according to claim 1,
wherein the first edge portion includes only the first side,
the second portion is included in a straight portion of the first trunk wiring line formed along the first side, and
the first portion is formed along the first side.
9. The display device according to claim 1,
wherein the second portion is included in the straight portion of the first trunk wiring line formed along the first side,
the first portion is included in a second straight portion of the first trunk wiring line extending from the straight portion of the first trunk wiring line, and the curved portion of the first trunk wiring line formed along the first irregular edge different in shape from the first edge portion formed along the first side, a line width of the second straight portion of the first trunk wiring line is smaller than a line width of the straight portion of the first trunk wiring line, and each of the line width of the second straight portion of the first trunk wiring line and the line width of the straight portion of the first trunk wiring line decreases with decreasing distance from the curved portion of the first trunk wiring line.

10. The display device according to claim 1, wherein the second trunk wiring line is provided in a frame-like shape and surrounds an edge of the display region except for at least a part of the edge of the display region facing the second portion.

11. The display device according to claim 10, wherein the second trunk wiring line includes a third portion formed along the first portion.

12. The display device according to claim 1, wherein a voltage of the first power supply voltage line is supplied to the second portion of the first trunk wiring line through a lead wiring line of the first power supply voltage line extending from the terminal portion.

13. The display device according to claim 1, wherein a voltage of the second power supply voltage line is supplied to the second trunk wiring line through a lead wiring line of the second power supply voltage line extending from the terminal portion.

14. The display device according to claim 1, wherein the first power supply voltage line further includes a third trunk wiring line, the third trunk wiring line is provided in the frame region along a second edge portion of the display region including a second side facing the first side, and the plurality of branch wiring lines are electrically connected to the third trunk wiring line, extend from the third trunk wiring line in a direction intersecting the second edge portion, and are provided in the frame region and the display region.

15. The display device according to claim 14, wherein the third trunk wiring line includes a fifth portion connected to some of the branch wiring lines intersecting an end portion of the second edge portion among the plurality of branch wiring lines, and includes a sixth portion connected to some other of the branch wiring lines intersecting a central portion of the second edge portion among the plurality of branch wiring lines, a line width of the fifth portion is smaller than a line width of the sixth portion, and an edge of the frame region provided with the fifth portion includes a second irregular frame edge having an irregular shape.

16. The display device according to claim 15, wherein the second irregular frame edge is an edge in which a width of at least a part of the frame region provided with the fifth portion is formed to be smaller than a width of the frame region provided with the sixth portion.

17. The display device according to claim 15, wherein at least one edge of both ends of the second edge portion is a second irregular edge different in shape from the second edge portion formed of the second side.

18. The display device according to claim 17, wherein the second irregular edge includes a curved edge or an inclined edge.

19. The display device according to claim 15, wherein a notch portion is formed in the display region, one side of the notch portion is the second side of the display region, the sixth portion is connected to some of the branch wiring lines intersecting the central portion of the second edge portion including the second side among the plurality of branch wiring lines, and the fifth portion is connected to some other of the branch wiring lines intersecting the end portion of the second edge portion among the plurality of branch wiring lines.

20. The display device according to claim 19, wherein a line width of the sixth portion increases with increasing distance from the fifth portion.

\* \* \* \* \*